US 6,660,946 B2

(12) United States Patent
Saiki et al.

(10) Patent No.: US 6,660,946 B2
(45) Date of Patent: Dec. 9, 2003

(54) PIN STANDING RESIN-MADE SUBSTRATE, METHOD OF MAKING PIN STANDING RESIN-MADE SUBSTRATE, PIN AND METHOD OF MAKING PIN

(75) Inventors: Hajime Saiki, Niwa-gun (JP); Noritaka Miyamoto, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 159 days.

(21) Appl. No.: 09/829,438

(22) Filed: Apr. 10, 2001

(65) Prior Publication Data

US 2002/0096361 A1 Jul. 25, 2002

(30) Foreign Application Priority Data

Apr. 10, 2000 (JP) .................................... P. 2000-108051
Oct. 13, 2000 (JP) .................................... P. 2000-313769
Jan. 18, 2001 (JP) .................................... P. 2000-009809

(51) Int. Cl.[7] ............................ H01R 12/04; H05K 1/11
(52) U.S. Cl. ...................... 174/267; 174/261; 29/844
(58) Field of Search ........................ 174/261, 267, 174/260; 861/772–776, 783; 257/779, 780; 29/844

(56) References Cited

U.S. PATENT DOCUMENTS 4,675,243 A * 6/1987 Obinata et al. ............. 428/210
5,484,964 A * 1/1996 Dawson et al. ............. 174/261
6,307,161 B1 * 10/2001 Grube et al. ................ 174/260
6,376,782 B1 * 4/2002 Kimura et al. .............. 174/267

FOREIGN PATENT DOCUMENTS

| JP | 63-272061 | 11/1988 | |
|---|---|---|---|
| JP | 6-21312 | 1/1994 | |
| JP | 08-191126 | * 7/1996 | ........... H01L/23/50 |
| JP | 2000-049252 | 2/2000 | |
| JP | 2000-164786 | 6/2000 | |

* cited by examiner

Primary Examiner—David L. Talbott
Assistant Examiner—Jeremy Norris
(74) Attorney, Agent, or Firm—Morgan, Lewis & Bockius LLP

(57) ABSTRACT

A pin standing resin substrate comprises: a resin substrate having a substantially plate-shaped main surface and comprising one of a resin and a composite material containing a resin, with a pin-pad exposed from the main surface; and a pin solder-jointed to the pin-pad, wherein the pin has been subjected to thermal treatment so as to soften the pin, and comprises a rod-like portion and an enlarged diameter portion having the same material as the rod-like portion, the enlarged diameter portion having a larger diameter than the rod-like portion and being formed at one end of the rod-like portion, and at least the enlarged diameter portion is soldered to the pin-pad.

31 Claims, 15 Drawing Sheets

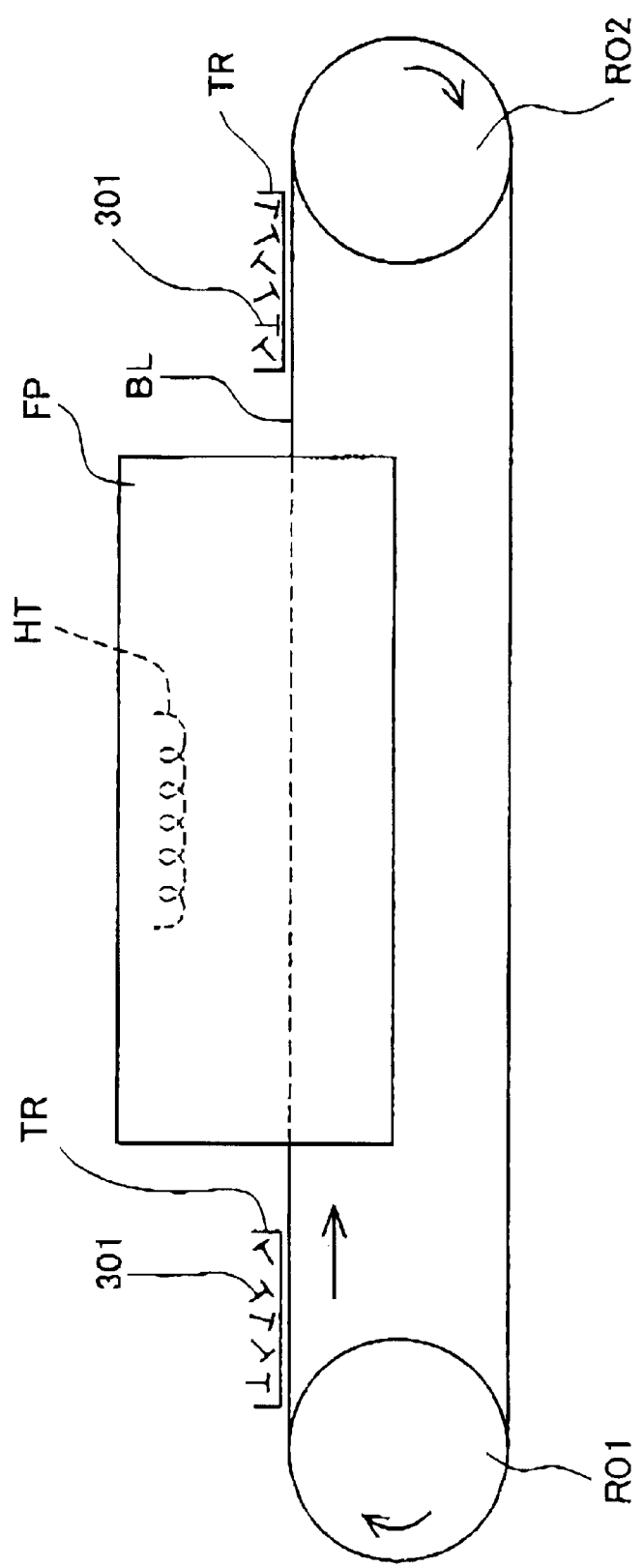

PIN STANDING RESIN-MADE SUBSTRATE, METHOD OF MAKING PIN STANDING RESIN-MADE SUBSTRATE, PIN AND METHOD OF MAKING PIN

BACKGROUND OF THE INVENTION

1. Field of the Invention

The present invention relates to a pin standing (pin grid array) resin substrate having the pins as input/output terminals erected thereon, a making method of the pin standing resin substrate, a pin as an input/output terminal for use in the pin standing substrate, and a making method of this pin, and more particularly to a pin standing resin substrate with an increased bonding strength between the pin and the resin substrate, a making method of the pin standing resin substrate, a pin capable of increasing the bonding strength with the resin substrate, and a making method of the pin.

2. Description of the Related Art

Conventionally, a pin standing resin substrate was known having the pins as input/output terminals standing on the resin substrate made of resin or a composite material containing resin.

For example, there is a pin standing resin substrate 201 as shown in a partly enlarged cross sectional view of FIG. 15. This pin standing resin substrate 201 is constituted of a resin substrate 203 having an almost (substantially) rectangular and substantially laminar (plate-like) shape and a number of pins 221 standing thereon.

The resin substrate 203 has a resin insulating layer 205 with a wiring layer (not shown) formed inside or on the surface, with a number of pin-pads 209 exposed from a solder resist layer 207 being formed on the side of a main surface 203A (upward in the figure).

On the other hand, a pin 221 is made of 194 alloy, for example, and comprises a rod-like portion 221A of substantially cylindrical shape and an enlarged diameter portion 221B like a substantial disk formed at the end of the pin-pad 209. And the pin 221 is fixed to the resin substrate 203 by bonding the whole of the enlarged diameter portion 221I and a part of the rod-like portion 221A on the side of the enlarged diameter portion 221B with the pin-pad 209 by solder HD. The pin 221 may be made of copper base metal such as pure copper, phosphor bronze, german silver and beryllium bronze, or iron base metal such as kovar (Fe—Ni—Co alloy) and 42 alloy (Ni(42 wt %)-Fe alloy), as well as 194 alloy.

However, such pin standing resin substrate 201 may be broken in a junction part when a stress is applied on the pin 221, because the bonding strength between the pin 221 and the pin-pad 209 is weak.

SUMMARY OF THE INVENTION

This invention has been achieved in the light of the above-mentioned problem, and it is an object of the invention to provide a pin standing resin substrate unlikely to break down due to a stress being applied on the pin, a making method of the pin standing resin substrate, a pin for use in the pin standing substrate, and a making method of the pin.

BRIEF DESCRIPTION OF THE INVENTION

FIG. 1 is an overall view of a pin according to an embodiment 1.

FIGS. 2A and 2B each is a view illustrating a method for making the pin according to the embodiment 1, wherein FIG. 2A is an explanatory view illustrating how a wire rod is sandwiched by the press dies, and FIG. 2B is an explanatory view illustrating how the wire rod is pressed to form an enlarged diameter portion partly.

FIGS. 3A and 3B each is a view illustrating a method for making the pin according to the embodiment 1, wherein FIG. 3A is an explanatory view illustrating how the wire rod having the enlarged diameter portion partly formed is sandwiched again by the press dies, and FIG. 3B is an explanatory view illustrating how the wire rod is pressed to form the enlarged diameter portion.

FIG. 4 is a schematic view illustrating a barrel polishing step for barrel polishing the pin.

FIGS. 5A and 5B each is a view illustrating a pin standing resin substrate according to the embodiment 1, wherein FIG. 5A is a side view and FIG. 5B is a partially enlarged cross-sectional view FIGS. 6A and 6B each is a view illustrating a method for making the pin standing resin substrate according to the embodiment 1, wherein FIG. 6A is an explanatory view illustrating how the soldering paste is applied on the pin-pads of a resin substrate, FIG. 6B is an explanatory view illustrating how the resin substrate is superposed on a pinning jig to contact the enlarged diameter portion of the pin with the soldering paste, and FIG. 6C is an explanatory view illustrating how the soldering paste is reflowed to solder the pin with the pin-pad.

FIGS. 7A and 7B each is a view illustrating a pin standing resin substrate according to an embodiment 2, wherein FIG. 7A is a side view and FIG. 7B is a partially enlarged cross-sectional view.

FIG. 9 is an explanatory view illustrating how the pin is thermally treated.

Figure 10A:
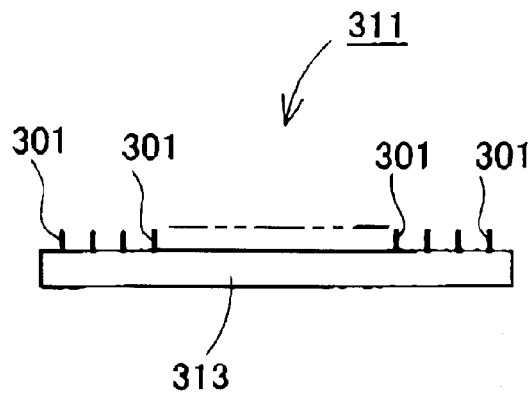
Figure 10B:
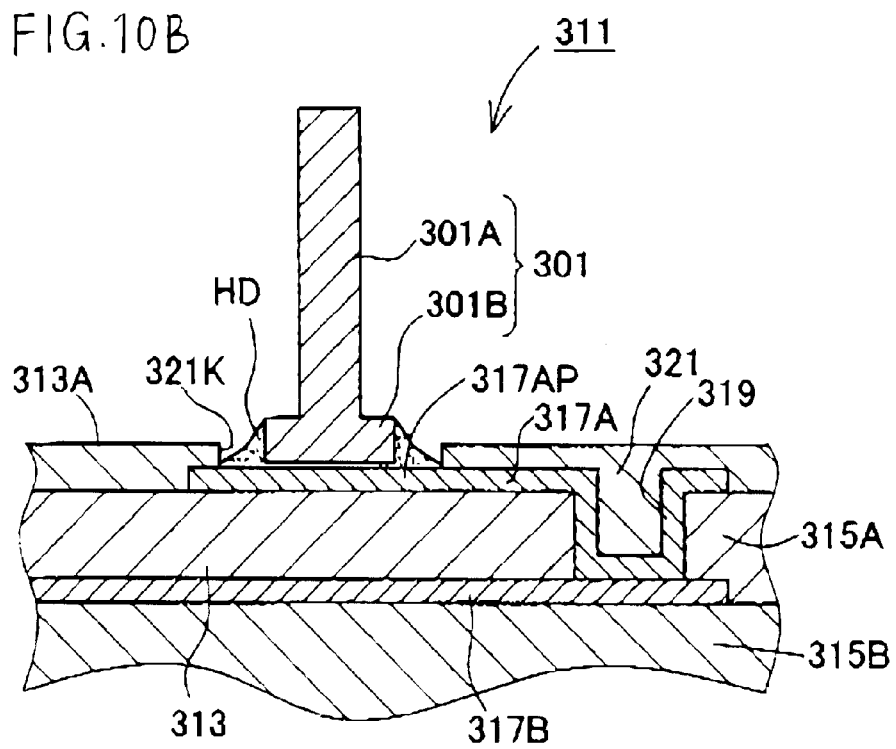

FIGS. 10A and 10B each is a view illustrating a pin standing resin substrate according to the embodiment 3, wherein FIG. 10A is a side view and FIG. 10B is a partially enlarged cross-sectional view.

Figure 11:
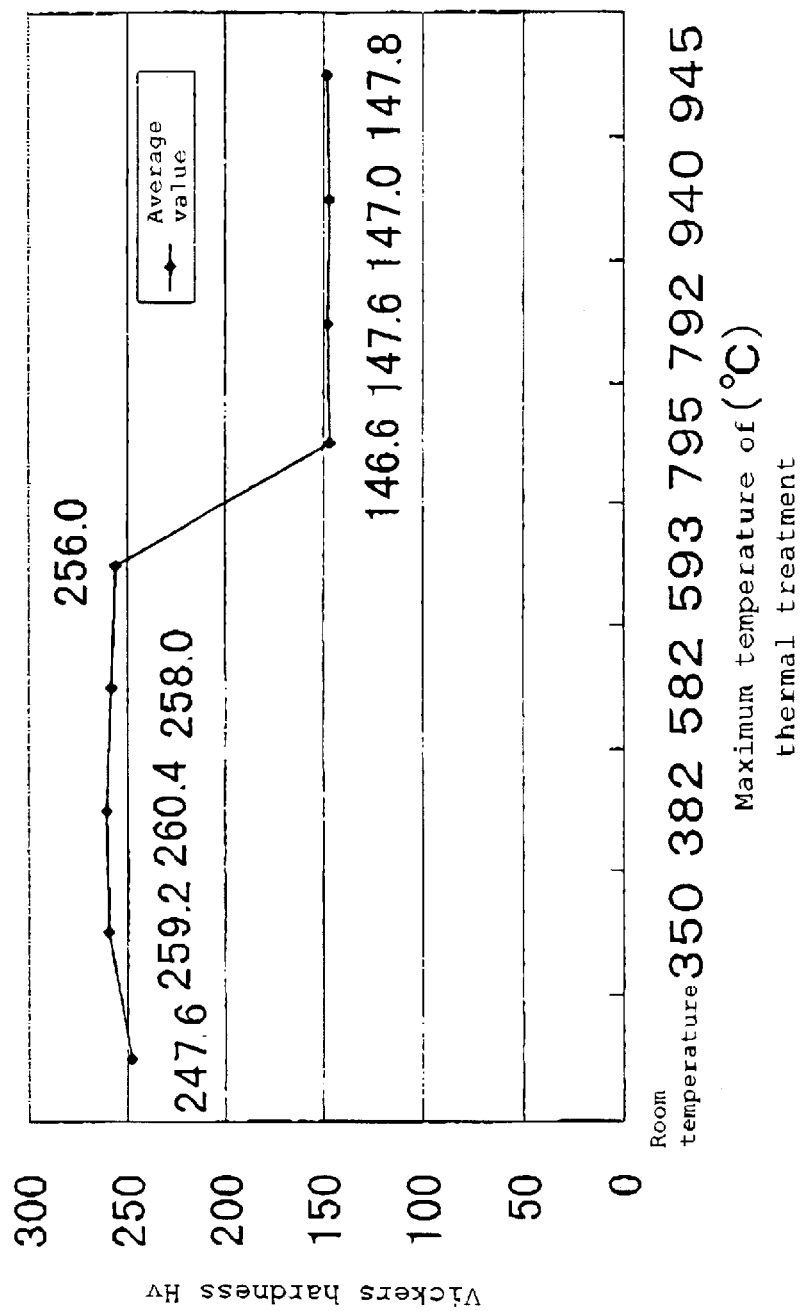
Figure 12:
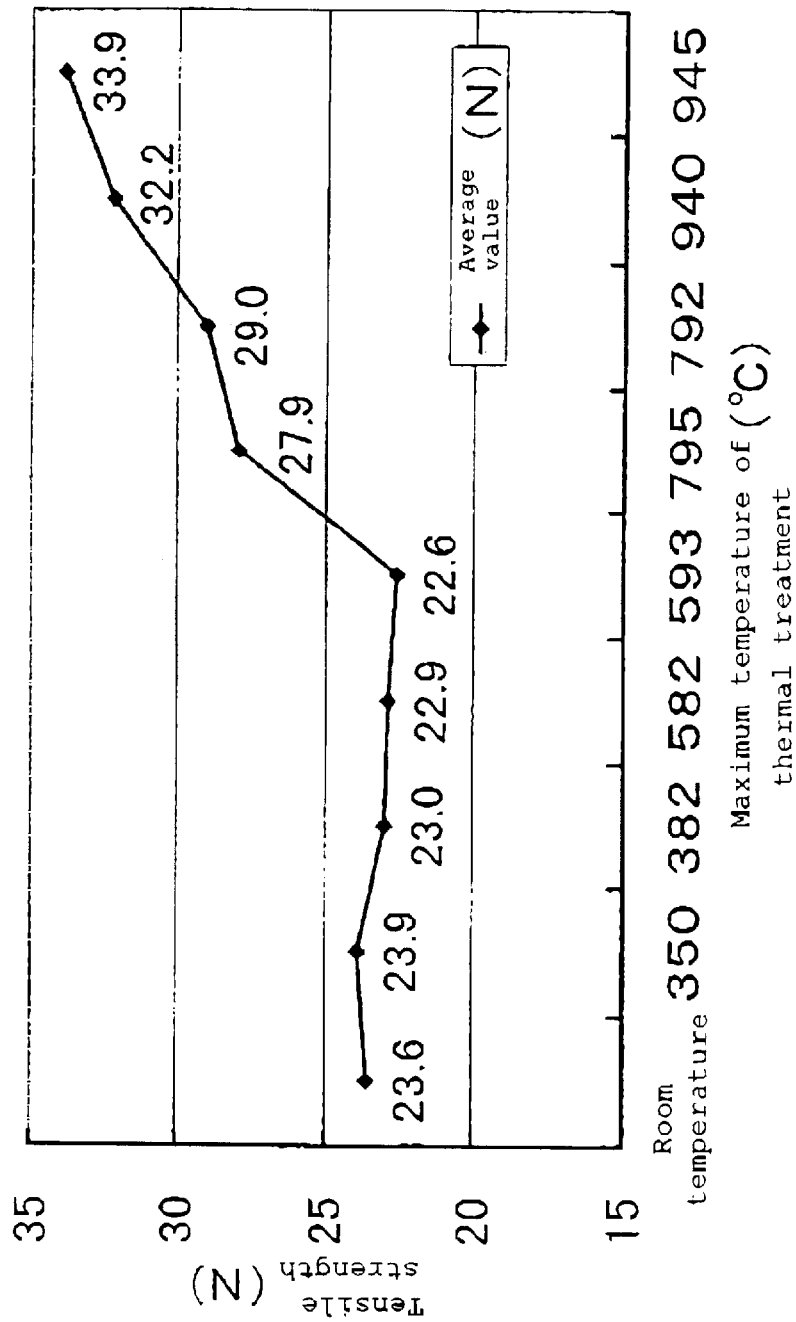

FIG. 11 is a graph showing the relation between the maximum temperature of thermal treatment and the average value of Vickers hardness Hv in the pins of kovar under different thermal treatment conditions FIG. 12 is a graph showing the relation between the maximum temperature of thermal treatment and the average value of tensile strength in the tensile test inclined 30 degrees for the pin standing resin substrate with the pins of kovar under different thermal treatment conditions.

Figure 13:
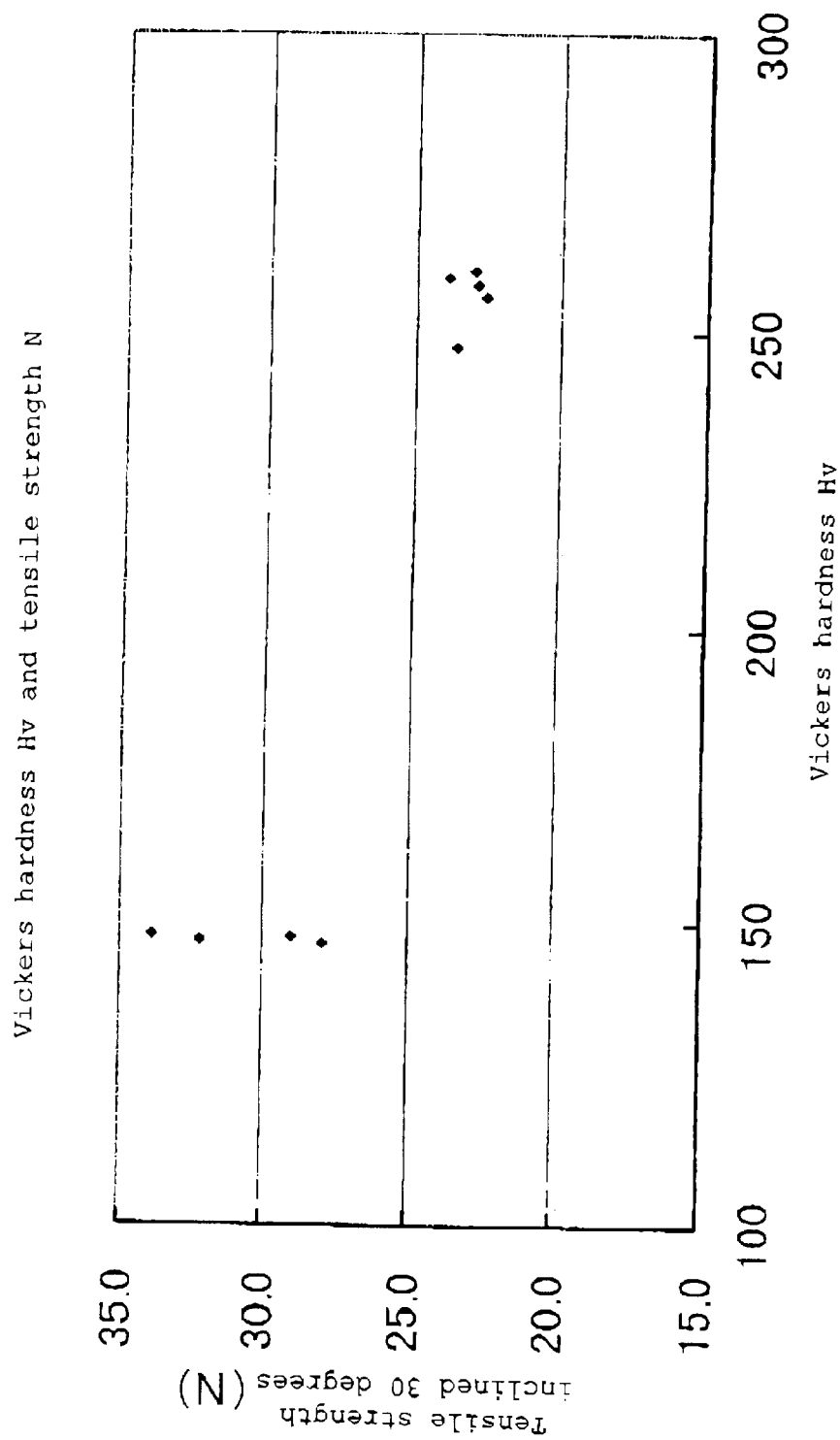

FIG. 13 is a graph showing the relation between the Vickers hardness Hv of the pin of kovar and the average value of tensile strength in the tensile test inclined 30 degrees for the pin standing resin substrate with the pins erected.

Figure 14A:
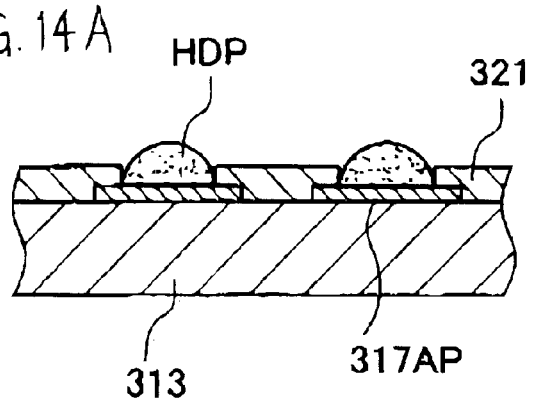
Figure 14B:
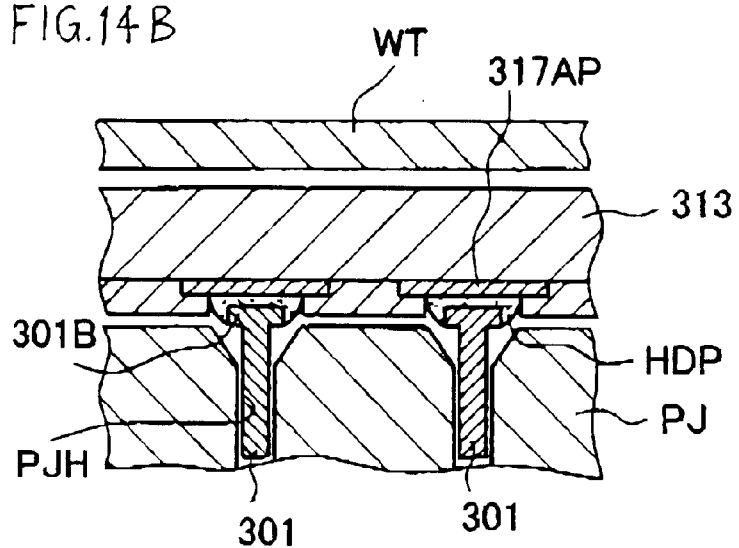
Figure 14C:
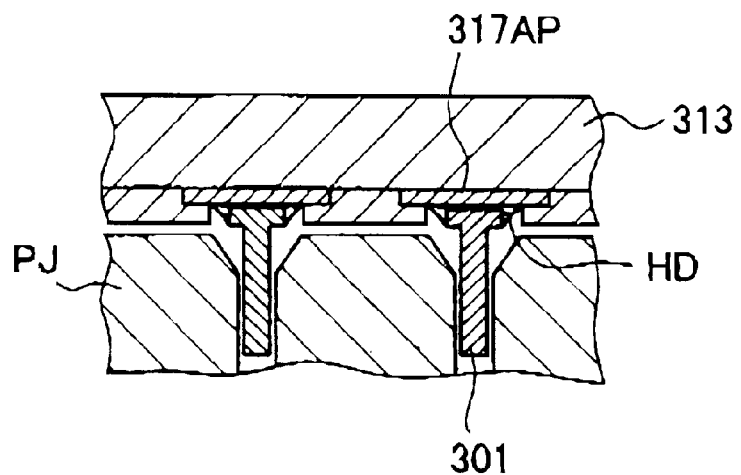

FIGS. 14A to 14C each is an explanatory view showing a pin fixing step in the method for making the pin standing resin substrate according to the embodiment 3, wherein FIG. 14A is a view illustrating a state where the soldering paste is applied on the pin-pad of the resin substrate, FIG. 14B is a view illustrating a state where the resin substrate is superposed on a pinning jig to contact the enlarged diameter portion of the pin with the soldering paste, and FIG. 14C is a view illustrating a state where the solder is reflowed to solder the pin on the pin-pad.

Figure 15:
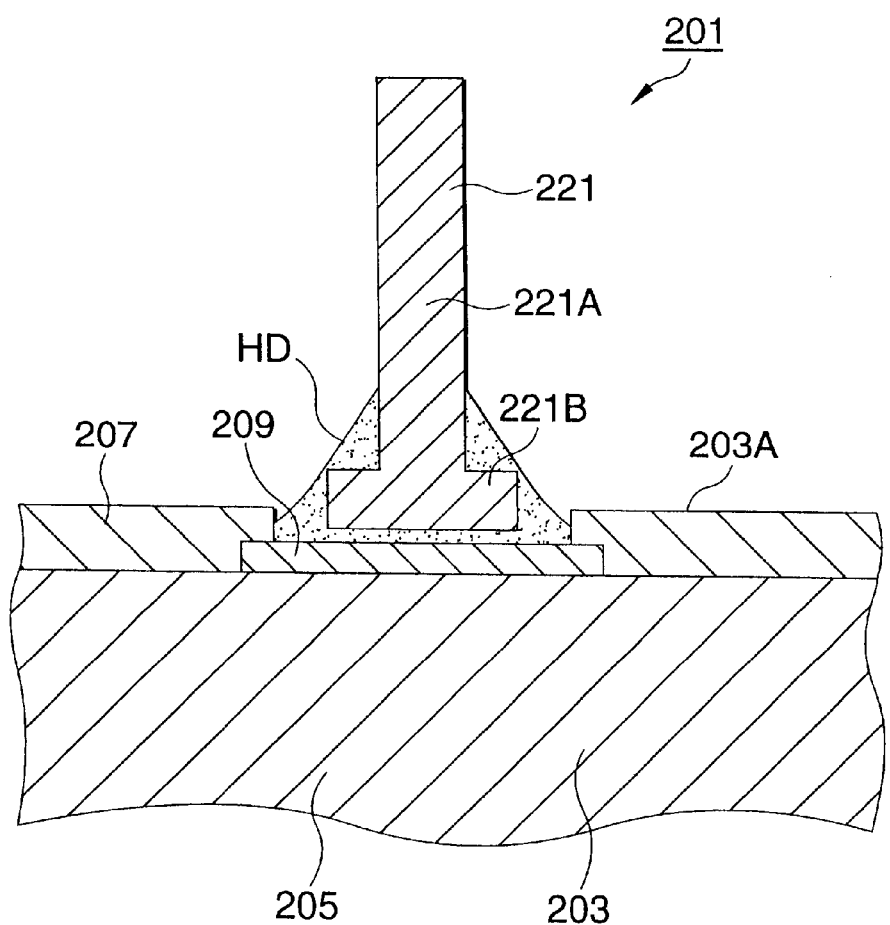

FIG. 15 is a partially enlarged cross-sectional view illustrating the pin standing resin substrate of the conventional art.

1, 301: pin
1A, 301A: rod-like portion
1B, 301B: enlarged diameter portion
11, 111, 311: pin standing resin substrate
13, 113, 313: resin substrate
13A, 113A, 313A: main surface (of resin substrate)
17AP, 117A?, 317AP: pin-pad
121, 321: concave portion
HD: solder

DETAILED DESCRIPTION OF THE INVENTION

According to one aspect of the invention, there is provided a pin standing resin substrate comprising:
  a resin substrate like a substantially laminar (plate-like) shape having a main surface and made of resin or a composite material containing resin, with a pin-pad exposed from the main surface; and
  a pin soldered to the pin-pad,
  the pin being subjected to thermal treatment and softened, and comprising a rod-like portion and an enlarged diameter portion made of the same material as the rod-like portion, with a larger diameter than the rod-like portion and formed at one end of the rod-like portion, and
  at least the enlarged diameter portion being soldered to the pin-pad.

The pin is typically obtained by forming a wire rod in a predetermined shape, but may be hardened owing to work distortion because a raw material is drawn to make the wire rod of a predetermined diameter. Also, it may be hardened by working the enlarged diameter portion. Therefore, the pin is considered to be harder than the raw material itself.

On the contrary, according to the invention, the pin is made softer owing to thermal treatment of heating than before the thermal treatment. Therefore, when a stress is applied on the pin, the pin itself is deformed to absorb the stress, so that the stress applied on a junction part between the pin and the resin substrate or the resin substrate itself can be relieved.

Accordingly, this pin standing resin substrate is unlikely to break down when the stress is applied on the pin, and is highly reliable.

By the way, in a pin standing ceramic substrate having the pins standing on the ceramic substrate, conventionally the pins are thermally treated at high temperatures. This is because the pins are normally brazed to the ceramic substrate and subjected to high temperatures, for example, about 800° C. in brazing.

On the contrary, in the pin standing resin substrate, the pins were soldered at temperatures as low as 200 to 300° C. in view of the heat resistance of the resin substrate, and the pins were not subjected to particularly high temperatures. Consequently, the pins were harder and could not absorb much stress.

However, in this invention, as above described, the pins are thermally treated and softened at a higher temperature than a soldering temperature before soldering, so that the stress applied on the pin is more likely to be absorbed, and the pin standing resin substrate is unlikely to break down.

The materials of the pin may be any metals, so long as the rod-like portion and the enlarged diameter portion are made of the same material, but may include copper base metals such as pure copper (oxygen free copper), 194 alloy (copper alloy), phosphor bronze, german silver and brass, and iron base metals such as kovar (iron-nickel-cobalt alloy) and 42 alloy (iron-nickel alloy).

Further, according to another aspect of the invention, there is provided a pin standing resin substrate comprising:
  a resin substrate like a substantially laminar (plate-like) shape having a main surface and made of resin or a composite material containing resin, with a pin-pad exposed from the main surface; and
  a pin soldered to the pin-pad,
  the pin being subjected to thermal treatment of heating up to 600° C. or higher, and comprising a rod-like portion and an enlarged diameter portion made of the same material as the rod-like portion, with a larger diameter than the rod-like portion and formed at one end of the rod-like portion, and
  at least the enlarged diameter portion being soldered to the pin-pad.

The pin may be typically harder, owing to work distortion caused during the shaping, than the raw material itself.

On the contrary, according to the invention, the pin is subjected to thermal treatment of heating the pin up to 600° C. or higher. Therefore, when a stress is applied on the pin, the pin itself is deformed to absorb the stress, so that the stress applied on a junction part between the pin and the resin substrate or the resin substrate itself can be relieved.

Accordingly, this pin standing resin substrate is unlikely to break down when the stress is applied on the pin, and is highly reliable.

According to a further aspect of the invention, there is provided a pin standing resin substrate comprising:
  a resin substrate like a substantially laminar (plate-like) shape having a main surface and made of resin or a composite material containing resin, with a pin-pad exposed from the main surface; and
  a pin soldered to the pin-pad,
  the pin being subjected to thermal treatment of heating from 600° C. to 900° C., and comprising a rod-like portion and an enlarged diameter portion made of the same material as the rod-like portion, with a larger diameter than the rod-like portion and formed at one end of the rod-like portion, and
  at least the enlarged diameter portion being soldered to the pin-pad.

According to the invention, the pin is made softer owing to thermal treatment of heating from 600° C. to 900° C. than the pin before the thermal treatment. Therefore, when a stress is applied on the pin, the pin itself is deformed to absorb the stress, so that the stress applied on a junction part between the pin and the resin substrate or the resin substrate itself can be relieved.

Accordingly, this pin standing resin substrate is unlikely to break down when the stress is applied on the pin, and is highly reliable.

By the way, in a pin standing ceramic substrate having the pins standing on the ceramic substrate, conventionally the pins are thermally treated at high temperatures. This is due to the fact that the pins are normally brazed to the ceramic substrate and subjected to high temperatures in brazing.

On the contrary, in the pin standing resin substrate, the pins are soldered at temperatures as low as about 200° C. in view of the heat resistance of the resin substrate, and the pins are not subjected to particularly high temperatures. Consequently, the pins were harder and could not absorb much stress.

However, in this invention, as above described, the pins are thermally treated at high temperatures and softened before the pins are solder-jointed to the pin-pads, so that the stress applied on the pin is more likely to be absorbed, and the pin standing resin substrate is unlikely to break down.

The materials of the pin may be any metals, so long as the rod-like portion and the enlarged diameter portion are made of the same material, but may include copper base metals such as pure copper (oxygen free copper), 194 alloy (copper alloy), phosphor bronze, german silver and brass, and iron base metals such as kovar (iron-nickel-cobalt alloy) and 42 alloy (iron-nickel alloy).

According to another aspect of the invention, there is provided a pin standing resin substrate comprising:

a resin substrate like a substantially laminar (plate-like) shape having a main surface and made of resin or a composite material containing resin, with a pin-pad exposed from the main surface; and a pin soldered to the pin-pad, the pin being subjected to thermal treatment of heating at 700° C. or higher, and comprising a rod-like portion made of kovar or 42 alloy, and an enlarged diameter portion made of the same material as the rod-like portion, with a larger diameter than the rod-like portion and formed at one end of the rod-like portion, and at least the enlarged diameter portion being soldered to the pin-pad.

The pin made of kovar or 42 alloy may be harder, owing to work distortion caused during the shaping, than the raw material itself without work distortion.

On the contrary, according to the invention, the pin made of kovar is subjected to thermal treatment of heating up to 700° C. or higher. Hence, the pin is softened securely and sufficiently. Therefore, when a stress is applied on the pin made of kovar, the pin itself is deformed to absorb the stress, so that the stress applied on a junction part between the pin and the resin substrate or the resin substrate itself can be relieved.

Accordingly, this pin standing resin substrate is unlikely to break down when the stress is applied on the pin, and is highly reliable.

In particular, when heated at 900° C. or higher, the pin has a fully higher tensile strength, resulting in particularly high connection reliability.

The thermal treatment of kovar or 42 alloy may be appropriately chosen in a range of temperatures lower than those melting points. However, if the pin is heated up to too high temperatures, the heating may cost a great deal, and it is preferable to heat the pin at temperatures of 1100° C. or less.

According to another aspect of the invention, there is provided a pin standing resin substrate comprising:

a resin substrate like a substantially laminar (plate-like) shape having a main surface and made of resin or a composite material containing resin, with a pin-pad exposed from the main surface; and a pin soldered to the pin-pad, the pin comprising a rod-like portion made of kovar or 42 alloy, and an enlarged diameter portion made of the same material as the rod-like portion, with a larger diameter than the rod-like portion and formed at one end of the rod-like portion, the pin having a Vickers hardness Hv of 200 or less, and at least the enlarged diameter portion being soldered to the pin-pad.

As described above, the pin obtained by forming the wire rod in a predetermined shape may be hardened by working owing to work distortion caused by making a raw material of kovar or 42 alloy a wire rod of a predetermined diameter or working to form the enlarged diameter portion. The pin made of kovar or42 alloy may have a Vickers hardness Hv above 200, for example, Hv=about 250 Such hard pin, when fixed to the resin substrate by soldering, is not easily deformed owing to a stress applied on the pin, and may be more likely to break down between it and the resin substrate.

On the contrary, according to the invention, the pin made of kovar or 42 alloy is soft with a Vickers hardness Hv of 200 or less. Therefore, when a stress is applied on the pin, the pin itself is deformed to absorb the stress, so that the stress applied on a junction part between the pin and the resin substrate or the resin substrate itself can be relieved.

Accordingly, this pin standing resin substrate is unlikely to break down when the stress is applied on the pin, and is highly reliable.

The pin may be afforded the Vickers hardness Hv of 200 or less by any of the methods, such as a method of casting the pin not to harden the pin, a method of heating the pin after forming the pin normally using a press or the like, a method of heating in a high frequency electromagnetic field, a method of heating the pin by laser beams, and a method of heating the pin within a furnace having a heater by radiation heat.

Also, in the pin standing resin substrate, the pin may be subjected to thermal treatment for reducing the Vickers hardness.

In this invention, the pin is subjected to thermal At treatment to reduce the Vickers hardness. The pin is produced through the ordinary process and the Vickers hardness is reduced in the thermal treatment at later stage. Hence, the pin that is easy to produce and available can be employed, resulting in inexpensive pin standing resin substrate.

Further, in the pin standing resin substrate, the pin is preferably passed through a belt furnace to make thermal treatment. Thermal treatment within the belt furnace, the whole of the pin can be thermally treated uniformly and securely, and processed inexpensively, resulting in cheap pin standing resin substrates.

The solder used for soldering the pin may be appropriately selected in consideration of the heat resistance of the pin standing resin substrate and the soldering temperature in mounting the electronic parts such as IC chips on the pin standing resin substrate. For example, an Sn/Sb base solder, a Pb/Sn base solder, and an Sn/Ag base solder may be adopted. These solders may contain additives of Cu, Ag, Bi, Au, Pb, In, Al, and As.

Accordingly, the pin standing resin substrate as described above preferably uses any one of the Sn/Sb base solder, the Pb/Sn base solder and the Sn/Ag base solder.

The Sn/Sb base solder, with a property of being slightly lower in wettability than the Pb/Sn base solder, and having relatively less wetting spread, is favorable in that the height of solder creeping up on the rod-like portion of the pin can be suppressed.

In the pin standing resin substrate, the pin is preferably mechanically polished prior to the thermal treatment.

At the time when produced by the press, the pin may have burr in various parts, or the sharp corner edge formed. Such burr or sharp corner edge is easily exfoliated, and becomes metal powder to stick to various parts of the substrate or other electronic parts, bringing about a danger of causing a short-circuit or insulation failure. Hence, the burr is removed by mechanical polishing such as barrel polishing, or the sharp corner edge is beveled. Such mechanical polishing may be performed before or after the thermal treatment of the pin. However, if such mechanical polishing is performed, the pin surface may be hardened owing to collision of the media or abrasive grain with the surface of pin. Accordingly, if the pin is mechanically polished after thermal treatment to soften the pin, the pin once softened is unfavorably hardened again.

On the contrary, if the pin is mechanically polished prior to being thermally treated, the pin can be softened by the thermal treatment although the pin may be hardened by mechanical polishing, whereby it is possible to eliminate any influence of the mechanical polishing.

The mechanical polishing may be effected by the barrel polishing, sand blast, shot blast, water jet with polishing powder, hydro-honing, or a brush with abrasive material. Among them, the barrel polishing is preferable as the mechanical polishing. With the barrel polishing, a large quantity of pins can be processed at a time and inexpensively, and uniformly in making the removal of burr or beveling.

The pin standing resin substrate as described above preferably has the pin such that the tensile strength inclined 30 degrees per unit area of pin-pad has an average value of 31.8N/mm2 or greater.

This pin standing resin substrate is unlikely to break down when a stress is applied on the pin, because the connection strength of pin is high, and is highly reliable.

Also, the pin standing resin substrate as described above preferably has the pin such that the tensile strength inclined 30 degrees per unit area of pin-pad has a minimum value of 28.3N/mm2 or greater.

This pin standing resin substrate is unlikely to break down when a stress is applied on the pin, because the connection strength of pin is high and there is less variation in connection strength without pins of extremely low connection strength, and is highly reliable, In the pin standing resin substrate, the enlarged diameter portion of the pin contains a spherical surface opposite to the rod-like portion.

A According to this invention, the enlarged diameter portion of the pin contains a spherical surface opposite to the side of the rod-like portion, whereby the pin and the pin-pad are soldered in a state where the spherical face of the enlarged diameter portion is directed to the pin-pad.

Therefore, the enlarged diameter portion can carry a larger amount of solder between the enlarged diameter portion of the pin and the pin-pad than the nailheaded pin, resulting in the increased bonding strength.

Since the enlarged diameter portion contains a spherical face, the stress being applied on the pin may be absorbed over the entire junction part, without the stress being concentrated on a specific point. Accordingly, the stress applied on the pin itself or on the resin substrate main body can be relieved Further, since the pin is thermally treated and softened, the pin itself can absorb a stress by deforming when the stress is applied on the pin. Hence, the stress applied on the junction part between the pin and the resin substrate, or on the resin substrate main body can be relieved.

Accordingly, this pin standing resin substrate is unlikely to break down when subjected to a stress, and is highly reliable, due to a synergetic effect thereof.

Further, in the pin standing resin substrate, the main surface has a concave portion having a bottom portion at least on which the pin-pad is exposed, and the pin has at least the enlarged diameter portion received within the concave portion and at least a part of the rod-like portion projecting from the main surface.

To increase the bonding strength between the pin and the resin substrate, it is preferable to increase the height (axial length) of the enlarged diameter portion and secure a larger amount of solder to bond the pin and the pin-pad. However, if the height of the enlarged diameter portion is increased, the pin, when inserted into a socket, results in a greater gap between the pin standing resin substrate and the socket owing to the enlarged diameter portion.

On the contrary, the pin standing resin substrate of this invention has a concave portion on the main surface of which the pin-pad is exposed at least on the bottom face, and the enlarged diameter portion of the pin is received within the concave portion, Accordingly, irrespective of the enlarged diameter portion of the pin being formed, when the pin is inserted into the socket, the gap between the pin standing resin substrate and the socket can be reduced.

According to another aspect of the invention, there is provided a method for making a pin standing resin substrate including:

a pin thermal treatment step of making thermal treatment by heating and softening a pin having a rod-like portion and an enlarged diameter portion made of the same material as the rod-like portion, with a larger diameter than the rod-like portion and formed at one end of the rod-like portion; and a pin fixing step of soldering a pin-pad with at least the enlarged diameter portion of the pin, so as to fix the pin with a resin substrate, wherein the resin substrate has a main surface having a substantially laminar (plate-like) shape and comprises resin or a composite material containing resin, with the pin-pad exposed from the main surface.

According to this invention, in the pin thermal treatment step, the pin is thermally treated by heating and softened. And in the pin fixing step, the pin softened is soldered to the pin-pad of the resin substrate.

Accordingly, the pin standing wiring substrate produced, when a stress is applied on the pin, the pin itself is likely to absorb the stress. Hence, the stress applied on the junction part between the pin and the resin substrate or on the resin substrate itself can be relieved. Therefore, with this making method, the pin standing resin substrate can be produced in which the pin is unlikely to break down when subjected to the stress.

According to a further aspect of the invention, there At is provided a method for making a pin standing resin substrate including:

a pin thermal treatment step of making thermal treatment by heating a pin at 600° C. or higher, the pin having a rod-like portion and an enlarged diameter portion made of the same material as the rod-like portion, with a larger diameter than the rod-like portion and formed at one end of the rod-like portion; and a pin fixing step of soldering a pin-pad with at least the enlarged diameter portion of the pin, so as to fix the pin with a resin substrate, wherein the resin substrate has a main surface having a substantially laminar (plate-like) shape and comprises resin or a composite material containing resin, with the pin-pad exposed from the main surface.

According to this invention, in the pin thermal treatment step, the pin is thermally treated by heating at 600° C. or higher, and thus softened And in the pin fixing step, the pin softened is soldered to the pin-pad of the resin substrate, Accordingly, the pin standing wiring substrate produced, when a stress is applied on the pin, the pin itself is likely to absorb the stress. Hence, the stress applied on the junction part between the pin and the resin substrate or on the resin substrate itself can be relieved. Therefore, with this making method, the pin standing resin substrate can be produced in which the pin is unlikely to break down when subjected to the stress.

According to another aspect of the invention, there is provided a method for making a pin standing resin substrate including:

- a pin thermal treatment step of making thermal treatment by heating a pin from 600° C. to 900° C., the pin having a rod-like portion and an enlarged diameter portion made of the same material as the rod-like portion, with a larger diameter than the rod-like portion and formed at one end of the rod-like portion; and
- a pin fixing step of soldering a pin-pad with at least the enlarged diameter portion of the pin, so as to fix the pin with a resin substrate, wherein the resin substrate has a main surface having a substantially laminar (plate-like) shape and comprises resin or a composite material containing resin, with the pin-pad exposed from the main surface.

According to this invention, in the pin thermal treatment step, the pin is thermally treated by heating from 600° C. to 900° C., and thus softened. And in the pin fixing step, the pin softened is soldered to the pin-pad of the resin substrate.

Accordingly, the pin standing wiring substrate produced, when a stress is applied on the pin, the pin itself is likely to absorb the stress. Hence, the stress applied on the junction part between the pin and the resin substrate or on the resin substrate itself can be relieved. Therefore, with this making method, the pin standing resin substrate can be produced in which the pin is unlikely to break down when subjected to the stress.

According to another aspect of the invention, there is provided a method for making a pin standing resin substrate if including:

- a pin thermal treatment step of making thermal treatment by heating a pin at 700° C. or higher, the pin having a rod-like portion made of kovar or 42 alloy and an enlarged diameter portion made of the same material as the rod-like portion, with a larger diameter than the rod-like portion and formed at one end of the rod-like portion; and
- a pin fixing step of soldering a pin-pad with at least the enlarged diameter portion of the pin, so as to fix the pin with a resin substrate, wherein the resin substrate has a main surface having a substantially laminar (plate-like) shape and comprises resin or a composite material containing resin, with the pin-pad exposed from the main surface.

According to this invention, in the pin thermal treatment step, the pin made of kovar or 42 alloy is thermally treated by heating at 700° C. or higher, and thus softened securely and fully. And in the pin fixing step, the pin softened is soldered to the pin-pad of the resin substrate.

Accordingly, the pin standing wiring substrate produced, when a stress is applied on the pin, the pin itself is likely to absorb the stress. Hence, the stress applied on the junction part between the pin and the resin substrate or on the resin substrate itself can be relieved. Therefore, with this making method, the pin standing resin substrate can be produced in which the pin is unlikely to break down when subjected to the stress.

The thermal treatment of kovar or 42 alloy may be appropriately chosen in a range of temperatures lower than those melting points. However, if the pin is heated up to too high temperatures, the heating may cost a great deal, and it is preferable to heat the pin at temperatures of 1100° C. or less.

According to a further aspect of the invention, there is provided a method for making a pin standing resin substrate including:

- a pin hardness reducing step of reducing the Vickers hardness of pin 1 to 200 or less, the pin having a rod-like portion made of kovar or 42 alloy and an enlarged diameter portion made of the same material as the rod-like portion, with a larger diameter than the rod-like portion and formed at one end of the rod-like portion; and
- a pin fixing step of soldering a pin-pad with at least the enlarged diameter portion of the pin, so as to fix the pin with a resin substrate, wherein the resin substrate has a main surface having a substantially laminar (plate-like) shape and comprises resin or a composite material containing resin, with the pin-pad exposed from the main surface.

According to this invention, the pin is made of kovar or 42 alloy, and in the pin hardness reducing step, the Vickers hardness Hv of the pin is reduced to 200 or less. And in the pin fixing step, the pin softened with reduced hardness is soldered to the pin-pad of the resin substrate.

Accordingly, the pin standing wiring substrate produced, when a stress is applied on the pin, the pin itself is likely to absorb the stress. Hence, the stress applied on the junction part between the pin and the resin substrate or on the resin substrate itself can be relieved. Therefore, with this making method, the pin standing resin substrate can be produced in which the pin is unlikely to break down when subjected to the stress.

The method for making the pin standing resin substrate may include the pin hardness reducing step that is the pin thermal treatment step of making thermal treatment by heating the pin to reduce the Vickers hardness.

In the case where the Vickers hardness of the pin is reduced by thermal treatment, a number of pins can be easily treated under the even conditions.

Further, in the method for making the pin standing resin substrate, the pin hardness reducing step preferably includes reducing the Vickers hardness owing to the thermal treatment of passing the pin through the belt furnace Owing to the thermal treatment through the belt furnace, the whole of the pin can be heated uniformly and securely to effect the thermal treatment, resulting in inexpensive pin standing resin substrates Further, the method for making the pin standing resin substrate further includes a mechanical polishing step of mechanically polishing the pin prior to the pin thermal treatment step.

At the time when produced by the press, the pin may have burr in various parts, or the sharp corner edge formed. Such burr or sharp corner edge is easily exfoliated, and becomes metal powder to stick to various parts of the substrate or other electronic parts, bringing about a danger of causing a short-circuit or insulation failure. Hence, the burr is removed by mechanical polishing such as barrel polishing, or the sharp corner edge is beveled. Such mechanical polishing may be performed before or after the thermal treatment of the pin.

However, if such mechanical polishing is performed, the pin surface may be hardened owing to collision of the media or abrasive grain with the surface of pin. Accordingly, if the pin is mechanically polished after thermal treatment to soften the pin, the pin once softened is unfavorably hardened again.

On the contrary, this invention includes the mechanically polishing step prior to the pin thermally treating step. Hence, the pin can be softened by the thermal treatment although the pin may be hardened by mechanical polishing, whereby it is possible to eliminate any influence of the mechanical polishing and fix the softer pin.

The mechanically polishing step may be effected by the barrel polishing, sand blast, shot blast, water jet with polishing powder, hydro-honing, or a brush with abrasive material.

In particular, in the method for making the pin standing resin substrate, the mechanically polishing step is preferably the barrel polishing step of barrel polishing the pin.

In this invention, the barrel polishing step of barrel polishing the pin is employed as the mechanically polishing step. With this barrel polishing, a large quantity of pins can be processed at a time and inexpensively, and uniformly in making the removal of burr or beveling.

According to a further aspect of the invention, there is provided a method for making a pin standing resin substrate including:

a pin fixing step of soldering a pin-pad with at least an enlarged diameter portion of a pin, so as to fix the pin with a resin substrate, wherein the resin substrate has a main surface having a substantially laminar (plate-like) shape and comprises resin or a composite material containing resin, with the pin-pad exposed from the main surface, the pin having a rod-like portion made of kovar or 42 alloy and the enlarged diameter portion made of the same material as the rod-like portion, with a larger diameter than the rod-like portion and formed at one end of the rod-like portion, the pin having a Vickers hardness Hv of 200 or less.

In this invention, the pin is made of kovar or 42 alloy, and has a Vickers hardness Hv of 200 or less. Hence, the pin can relieve the stress which is applied on the pin, and has a greater bonding strength between the fixed pin and the resin substrate. Therefore, the pin standing resin substrate has a higher reliability.

In the method for making the pin standing resin substrate, the pin thermally treating step preferably includes making thermal treatment of heating the pin having the enlarged diameter portion of the pin containing a spherical surface opposite to the side of the rod-like portion.

With this invention, in the pin fixing step, the pin having the enlarged diameter portion containing the spherical surface is soldered with the pin-pad. Hence, in the produced pin standing substrate, the pin is likely to absorb a stress over the junction part when the stress is applied on the pin. Therefore, the stress applied on the pin or resin substrate main body can be relieved.

The pin having the enlarged diameter portion containing the spherical surface is fixed to the pin-pad, securing a quantity of solder between them, and increasing the bonding strength.

Further, since the pin is softened in the pin thermal treatment step, when a stress is applied on the pin, the pin itself can also absorb the stress. Hence, the stress applied on the junction part between the pin and the resin substrate or the resin itself can be relieved.

Accordingly, due to their synergetic effect, with the making method of this invention, it is possible to produce the pin standing resin substrate that is unlikely to break down even though the stress is applied on the pin, According to another aspect of the invention, there is provided a pin for use in a pin standing substrate having the pins as input/output terminals standing thereon, comprising:
a rod-like portion; and
an enlarged diameter portion made of the same material as the rod-like portion, with a larger diameter than the rod-like portion and formed at one end of the rod-like portion,
wherein the pin is subjected to thermal treatment of heating and softened.

The pin of this invention is softened owing to thermal treatment of heating, and softer than the pin without the thermal treatment. Therefore, if the pin standing resin substrate with this pin is produced, the pin itself is prone to absorb a stress, when the stress is applied on the pin. As a result, the stress applied on a junction part between the pin and the resin substrate or the resin substrate itself can be relieved.

Accordingly, this pin standing resin substrate using the pin of this invention is unlikely to break down when the stress is applied on the pin, and is highly reliable.

According to a further aspect of the invention, there is provided a pin for use in a pin standing substrate having the pins as input/output terminals standing thereon, comprising:
a rod-like portion; and
an enlarged diameter portion made of the same material as the rod-like portion, with a larger diameter than the rod-like portion and formed at one end of the rod-like portion,
wherein the pin is subjected to thermal treatment of heating the pin at 600° C. or higher.

The pin of this invention is softened owing to thermal treatment of heating the pin at 600° C. or higher, and softer than the pin without the thermal treatment. Therefore, if the pin standing resin substrate with this pin is produced, the pin itself is prone to absorb a stress, when the stress is applied on the pin. As a result, the stress applied on a junction part between the pin and the resin substrate or the resin substrate itself can be relieved.

Accordingly, this pin standing resin substrate using the pin of this invention is unlikely to break down when the stress is applied on the pin, and is highly reliable.

According to another aspect of the invention, there is provided a pin for use in a pin standing substrate having the pins as input/output terminals standing thereon, comprising:
a rod-like portion; and
an enlarged diameter portion made of the same material as the rod-like portion, with a larger diameter than the rod-like portion and formed at one end of the rod-like portion,
wherein the pin is subjected to thermal treatment of heating the pin from 600° C. to 900° C.

The pin of this invention is softened owing to thermal treatment of heating the pin from 600° C. to 900° C., and softer than the pin without the thermal treatment. Therefore, if the pin standing resin substrate with this pin is produced, the pin itself is prone to absorb a stress, when the stress is applied on the pin. As a result, the stress applied on a junction part between the pin and the resin substrate or the resin substrate itself can be relieved.

Accordingly, this pin standing resin substrate using the pin of this invention is unlikely to break down when the stress is applied on the pin, and is highly reliable.

According to another aspect of the invention, there is provided a pin for use in a pin standing substrate having the pins as input/output terminals standing thereon, comprising:
a rod-like portion made of kovar or 42 alloy; and
an enlarged diameter portion made of the same material as the rod-like portion, with a larger diameter than the rod-like portion and formed at one end of the rod-like portion,
wherein the pin is subjected to thermal treatment of heating the pin at 700° C. or higher.

The pin of this invention is softened owing to thermal treatment of heating the pin at 700° C. or higher, and softer than the pin made of kovar or 42 alloy without the thermal treatment. Therefore, if the pin standing resin substrate with this pin is produced, the pin itself is prone to absorb a stress, when the stress is applied on the pin. As a result, the stress applied on a junction part between the pin and the resin substrate or the resin substrate itself can be relieved.

Accordingly, this pin standing resin substrate using the pin of this invention is unlikely to break down when the stress is applied on the pin, and is highly reliable.

According to a further aspect of the invention, there is provided a pin for use in a pin standing substrate having the pins as input/output terminals standing thereon, comprising:
 a rod-like portion made of kovar or 42 alloy; and
 an enlarged diameter portion made of the same material as the rod-like portion, with a larger diameter than the rod-like portion and formed at one end of the rod-like portion, wherein the pin has a Vickers hardness of 200 or less.

The pin of this invention is made of kovar or 42 alloy, but soft with a Vickers hardness of 200 or less. Therefore, if the pin standing resin substrate with this pin soldered is produced, the pin itself is prone to absorb a stress, when the stress is applied on the pin. As a result, the stress applied on a junction part between the pin and the resin substrate or the resin substrate itself can be relieved.

Accordingly, this pin standing resin substrate using the pin of this invention is unlikely to break down when the stress is applied on the pin, and is highly reliable.

The pin has the Vickers hardness that is reduced by thermal treatment of heating the pin.

The pin of this invention has the Vickers hardness reduced by thermal treatment. Accordingly, there is no need of employing the pin with low hardness from the beginning. Hence, the pin is produced by the normal method, with the Vickers hardness reduced by the later thermal treatment. Therefore, the pin is easily available, and is inexpensive.

The pin is preferably mechanically polished prior to the pin thermally treating step.

At the time when the pin is produced, the pin may have the burr or sharp corner edge. Hence, the burr is removed by mechanical polishing such as barrel polishing, or the sharp corner edge is beveled. Such mechanical polishing may be performed before or after the thermal treatment of the pin. However, if such mechanical polishing is performed, the pin surface may be hardened owing to collision of the media or abrasive grain with the surface of pin. Accordingly, it is unfavorable that the pin is mechanically polished after thermal treatment, because the pin once softened is hardened again.

On the contrary, if the pin is mechanically polished prior to the thermal treatment as described above, the pin can be softened by thermal treatment even though the pin may be hardened by mechanical polishing. Hence, it is possible to eliminate any influence of the mechanical polishing.

Of the mechanically polishing, the barrel polishing is preferable. With this barrel polishing, a large quantity of pins can be processed at a time and inexpensively, and uniformly in making the removal of burr or beveling.

Further, the pin has the enlarged diameter portion that contains a spherical surface opposite to the side of the rod-like portion.

Therefore, if the pin standing substrate with the pin of the invention is produced, the pin standing substrate is likely to absorb a stress at a junction part between the pin and the substrate, when the stress is applied on the pin. Hence, the stress applied on the pin itself or the substrate itself can be relieved. Also, it is possible to carry a larger amount of solder between the enlarged diameter portion of the pin containing the spherical surface and the pin-pad, resulting in the increased bonding strength.

Accordingly, if the pin standing substrate with the pin of this invention is produced, this pin standing resin substrate is unlikely to break down when subjected to a stress, and is highly reliable, due to a synergetic effect that the pin is thermally treated at high temperatures and softened.

According to another aspect of the invention, there is provided a method for making a pin for use in a pin standing substrate having the pins as input/output terminals standing thereon, including:
 a thermal treatment step of making thermal treatment by heating and softening a pin, the pin a rod-like portion and an enlarged diameter portion made of the same material as the rod-like portion, with a larger diameter than the rod-like portion and formed at one end of the rod-like portion.

With this invention, the pin is subjected to thermal treatment of heating, and softened. Accordingly, if the pin standing substrate with the pin of the invention is produced, the pin itself is prone to absorb a stress, when the stress is applied on the pin. Hence, the stress applied on the junction part between the pin and the substrate or the substrate itself can be relieved.

Hence, if the pin standing substrate is produced using the pin of this invention produced by this making method, this pin standing resin substrate is unlikely to break down when a stress is applied on the pin, and is highly reliable.

According to a further aspect of the invention, there is provided a method for making a pin for use in a pin standing substrate having the pins as input/output terminals standing thereon, including:
 a thermal treatment step of making thermal treatment by heating a pin at 600° C. or higher, the pin a rod-like portion and an enlarged diameter portion made of the same material as the rod-like portion, with a larger diameter than the rod-like portion and formed at one end of the rod-like portion.

With this invention, the pin is subjected to thermal treatment of heating the pin at 600° C. or higher in the thermal treatment step. Hence, the pin is made softer owing to thermal treatment of heating than before the thermal treatment.

Accordingly, if the pin standing substrate with this pin is produced, the pin itself absorbs a stress, when the stress is applied on the pin As a result, the stress applied on a junction part between the pin and the resin substrate or the resin substrate itself can be relieved.

Accordingly, if this pin standing resin substrate is produced using the pin manufactured by this making method, the pin standing resin substrate is unlikely to break down when the stress is applied on the pin, and is highly reliable.

According to another aspect of the invention, there is provided a method for making a pin for use in a pin standing substrate having the pins as input/output terminals standing thereon, including:
 a thermal treatment step of making thermal treatment by heating a pin from 600° C. to 900° C., the pin a rod-like portion and an enlarged diameter portion made of the same material as the rod-like portion, with a larger diameter than the rod-like portion and formed at one end of the rod-like portion.

With this invention, the pin is subjected to thermal treatment of heating the pin from 600° C. to 900° C. in the thermal treatment step. Hence, the pin is made softer owing to thermal treatment of heating than before the thermal treatment.

Accordingly, if the pin standing substrate with this pin is produced, the pin itself absorbs a stress, when the stress is applied on the pin. As a result, the stress applied on a junction part between the pin and the resin substrate or the resin substrate itself can be relieved.

Therefore, if this pin standing resin substrate is produced using the pin manufactured by this making method, the pin standing resin substrate is unlikely to break down when the stress is applied on the pin, and is highly reliable According to a further aspect of the invention, there is provided a method for making a pin for use in a pin standing substrate having the pins as input/output terminals standing thereon, including:

a thermal treatment step of making thermal treatment by heating a pin at 700° C. or higher, the pin a rod-like portion made of kovar or 42 alloy and an enlarged diameter portion made of the same material as the rod-like portion, with a larger diameter than the rod-like portion and formed at one end of the rod-like portion.

With this invention, the pin is subjected to thermal treatment of heating the pin made of kovar or 42 alloy at 700° C. or higher in the thermal treatment step. Hence, the pin made of kovar or 42 alloy is made softer owing to thermal treatment of heating than before the thermal treatment.

Accordingly, if the pin standing substrate with this pin is produced, the pin itself absorbs a stress, when the stress is applied on the pin. As a result, the stress applied on a junction part between the pin and the resin substrate or the resin substrate itself can be relieved.

Therefore, if this pin standing resin substrate is produced using the pin manufactured by this making method, the pin standing resin substrate is unlikely to break down when the stress is applied on the pin, and is highly reliable.

According to a further aspect of the invention, there is provided a method for making a pin for use in a pin standing substrate having the pins as input/output terminals standing thereon, including:

a pin hardness reducing step of reducing the Vickers hardness of a pin at 200 or less, the pin a rod-like portion made of kovar or 42 alloy and an enlarged diameter portion made of the same material as the rod-like portion, with a larger diameter than the rod-like portion and formed at one end of the rod-like portion.

The making method of the pin according to the invention includes the pin hardness reducing step of reducing the Vickers hardness of the pin. Accordingly, there is no need of employing the pin with low hardness from the beginning. Hence, the hard pin is produced by the normal method or obtained, with the Vickers hardness reduced by the later step Therefore, the pin is easily available or can be easily produced. As a result, the soft pin can be produced inexpensively.

Further, the method for making the pin may include the pin hardness reducing step that is the thermal treatment step of making thermal treatment by heating the pin to reduce the Vickers hardness.

Further, the making method of the pin preferably involves the thermal treatment step of passing the pin through a belt furnace to make thermal treatment. With the thermal treatment within the belt furnace, the whole of the pin can be thermally treated uniformly and securely, and processed inexpensively, resulting in less expensive pins.

Further, in the case where the enlarged diameter portion of the pin contains a spherical surface opposite to the side of the rod-like portion, the pin standing substrate with this pin can absorb a stress at a junction part between the pin and the substrate, when the stress is applied on the pin. As a result, the stress applied on the pin itself or the substrate itself can be relieved.

Also, it is possible to secure a quantity of solder between the enlarged diameter portion containing the spherical surface and the pin-pad.

Accordingly, if the pin standing substrate is produced using the pin manufactured by the making method, due to a synergetic effect that the pin is softened, it is possible to produce the pin standing resin substrate that is unlikely to break down even though the stress is applied on the pin.

Further, the method for making the pin further includes a mechanical polishing step of mechanically polishing the pin prior to the thermal treatment step.

At the time when produced by the press, the pin may have burr in various parts, or the sharp corner edge formed. Such burr or sharp corner edge is easily exfoliated, and becomes metal powder to stick to various parts of the substrate or other electronic parts, bringing about a danger of causing a short-circuit or insulation failure. Hence, the burr is removed by mechanical polishing such as barrel polishing, or the sharp corner edge is beveled. Such mechanical polishing may be performed before or after the thermal treatment of the pin.

However, if such mechanical polishing is performed, the pin surface may be hardened owing to collision of the media or abrasive grain with the surface of pin. Accordingly, if the pin is mechanically polished after thermal treatment to soften the pin, the pin once softened is unfavorably hardened again.

On the contrary, if the pin is mechanically polished prior to being thermally treated, the pin can be softened by the thermal treatment although the pin may be hardened by mechanical polishing. Therefore, the soft pin can be produced by eliminating any influence of the mechanical polishing.

In particular, the making method of the pin preferably includes the mechanical polishing step that is the barrel polishing step of barrel polishing the pin.

In the invention, the mechanical polishing step is the barrel polishing step of making the barrel polishing. With the barrel polishing, a large quantity of pins can be processed at a time and inexpensively, and uniformly in making the removal of burr or beveling.

PREFERRED EMBODIMENTS OF THE INVENTION

Embodiment 1

An embodiment 1 will be described below with reference to the drawings.

Figure 1:
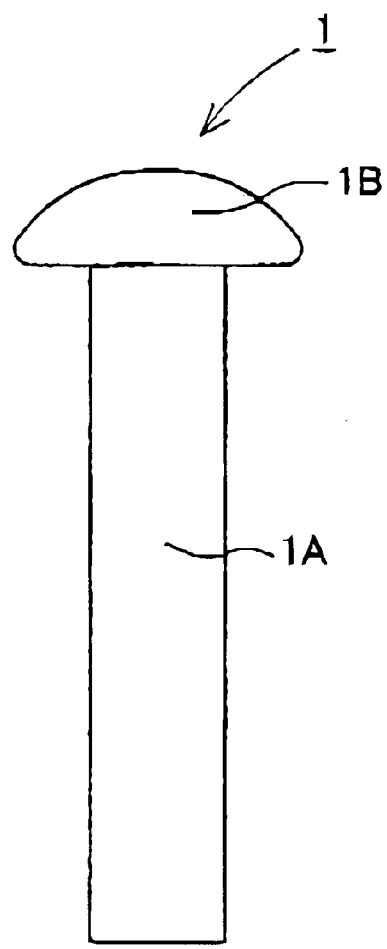

FIG. 1 shows a pin 1 of this embodiment. This pin 1 is made of 194 alloy, and formed with an Ni plated layer having a thickness of about 3.34 $\mu$m on its surface and an Au plated layer having a thickness of about 0.35 $\mu$thereon (not shown). The pin 1 is constituted of a rod-like portion 1A (shaft portion) and an enlarged diameter portion 1B formed at one end. The rod-like portion 1A has a diameter of about 0.45 mm and a height (axial length) of 3.01 mm, and is almost cylindrical. On the other hand, the enlarged diameter portion 1B (flange) has a shape with a spherical surface in an opposite direction to the side of the rod-like portion 1A, more specifically, a hemispherical shape swelling in an opposite direction to the side of the rod-like portion 1A. The maximum diameter of the enlarged diameter portion 1B is roughly 1.1 mm, its height (axial length) being 0.34 mm.

Also, this pin 1 is thermally treated, or heated up to 600° C. to 900° C. and then cooled slowly.

Since this pin 1 has the enlarged diameter portion 1B of hemispherical shape, a pin standing substrate with this enlarged diameter portion 1B (spherical surface) soldered thereto is likely to absorb a stress over a junction part between the pin 1 and the substrate, when the stress is applied on the pin 1. Therefore, the pin 1 itself or the substrate itself has less stress applied thereon.

Also, since the pin 1 and the substrate can be bonded with a quantity of solder, the bonding strength can be increased Further, this pin 1 is subjected to thermal treatment of heating up to 600° C. to 900° C. Hence, this pin 1 is softer than the pin without thermal treatment. Therefore, if the pin standing substrate is produced using this pin 1, the pin standing substrate can relieve the stress applied on the junction part between the pin 1 and the substrate or the substrate itself, because the pin 1 is prone to absorb a stress when the stress is applied on the pin 1.

Accordingly, the pin standing substrate produced using this pin 1 is unlikely to break down when the stress is applied on the pin 1, and is highly reliable Referring now to FIGS. 1 to 4, a method for making the pin 1 will be described below.

Figure 2A:
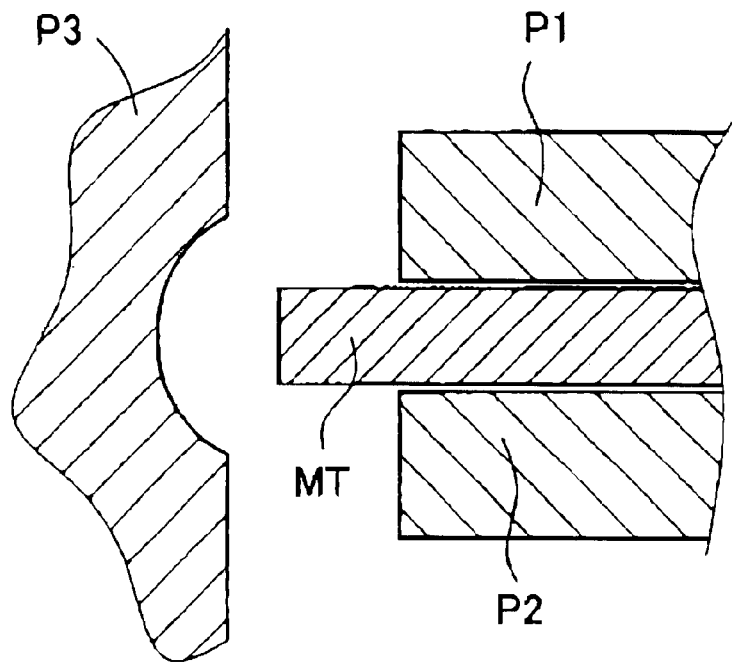

First of all, a wire rod MT made of 194 alloy, substantially circular in cross section, is prepared (see FIG. 2A). Then, in a first grasping step, the wire rod MT is grasped by the press dies P1, P2 so that a part of the wire rod MT may project therefrom, as shown in FIG. 2A.

Figure 2B:
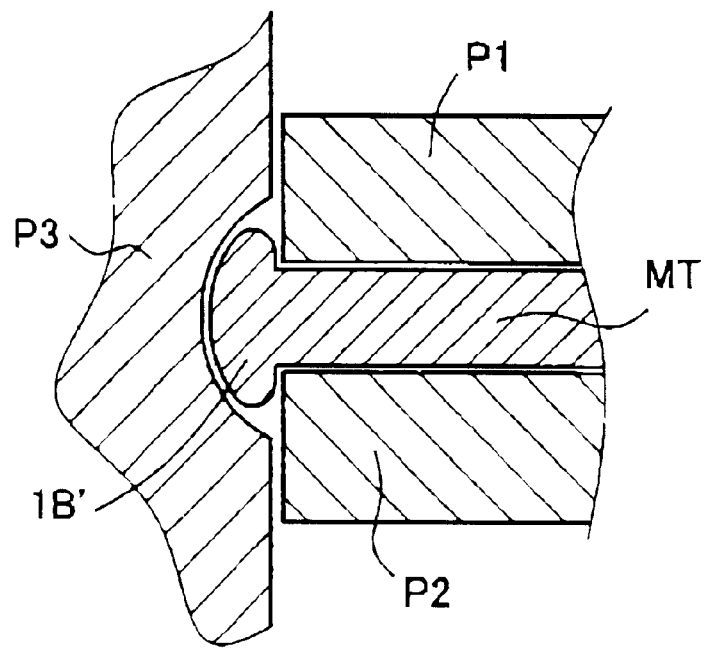

Then, in a first press step, the wire rod MT is pressed by the press dies P1, P2 and a press die P3 to form an enlarged diameter portion 1B' having a larger diameter than the wire rod MT and containing a spherical surface at the top end, as shown in FIG. 2B.

Figure 3A:
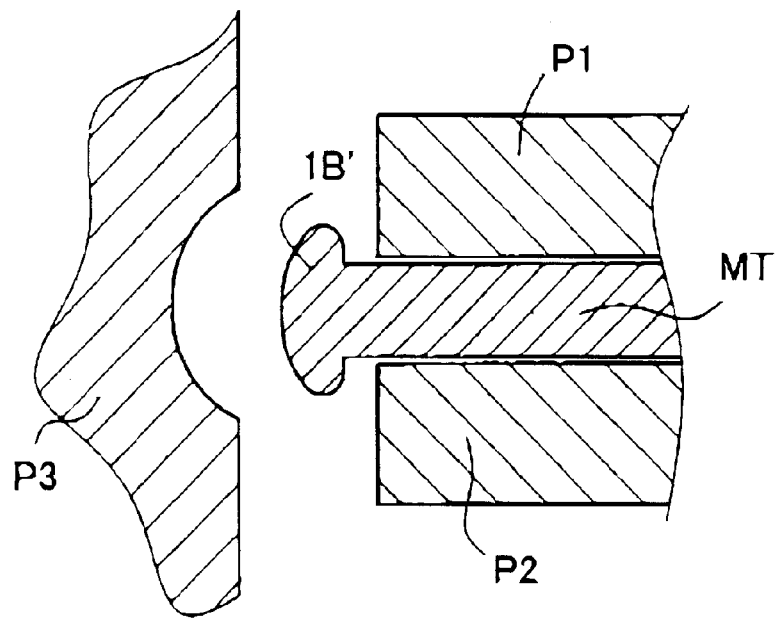

In a second grasping step, the wire rod MT is grasped again by the press dies P1, P2 so that a part of the wire rod MT may further project, as shown in FIG. 3A.

Figure 3B:
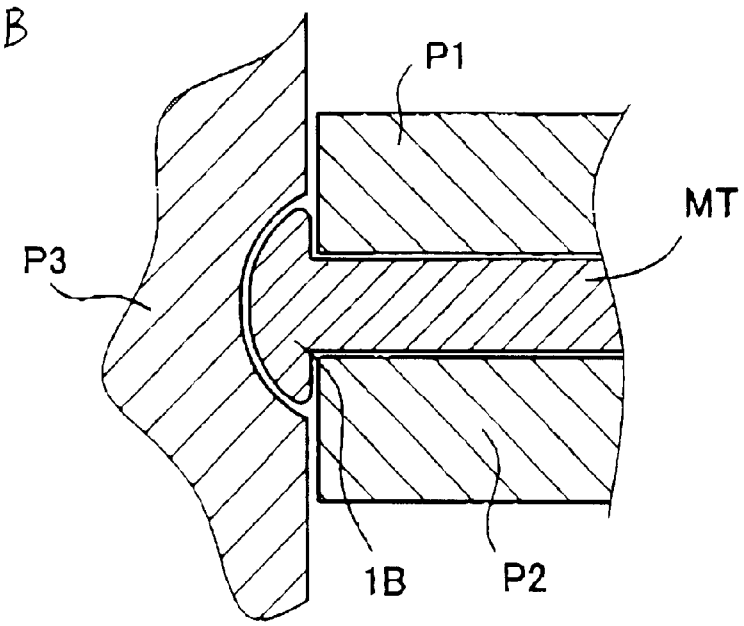

Then, in a second press step, the wire rod MT is pressed again to further make the enlarged diameter portion 1B', as shown in FIG. 3B. Thereby, the enlarged diameter portion 1B of the pin 1 is formed. The enlarged diameter portion 1B having a height (axial length) can be formed by pressing the wire rod MT multiple times.

Then, in a cutting step, the wire rod MT is cut at a predetermined position to form the rod-like portion 1A substantially equivalent in diameter to the wire rod MT. After cutting the wire rod MT, the pin 1 is subjected to a surface smoothing treatment involving the barrel polishing and the chemical etching by a well-known method to remove the burr or bevel the sharp corner edge.

Figure 4:
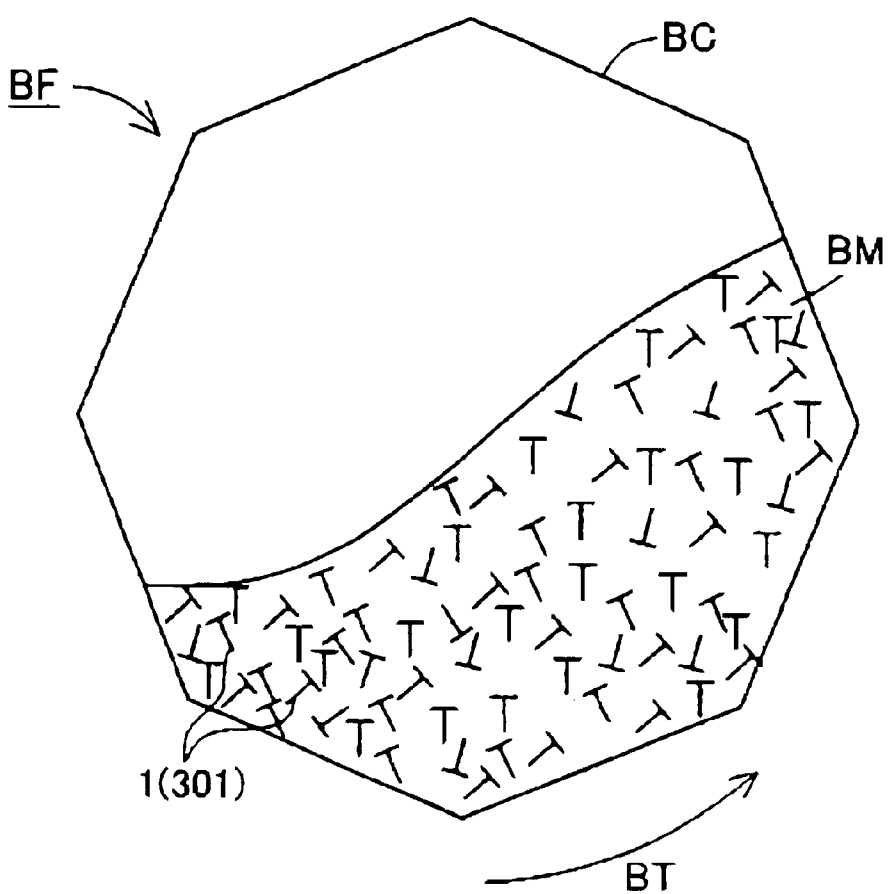

Specifically, in a barrel polishing step, a number of pins, together with media BM composed of alumina ball having a diameter of 3.0 to 5.0 mm, are entered into a rotational vessel BC, employing a well-known rotational barrel polishing machine BF, and rotated a few hours as indicated by the arrow BT, as shown in FIG. 4. Thereby, the burr of the pin 1 is removed, and the sharp corner edge is beveled. Since the media BM collides against the pin 1 in the barrel polishing, the surface of the pin 1 is hardened by work hardening.

Then, in a surface smoothing process of chemical etching the pin 1 after the barrel polishing, the pin 1 is dipped into an acid solution to dissolve and remove partially the surface, so that the surface is made smooth. This surface smoothing process is favorable because it allows the media SM sticking to the pin 1 to be removed.

Then, in a thermal treatment step, the pin 1 is subjected to thermal treatment of heating up to 600° C. to 900° C. More specifically, the pin 1 is heated to a maximum temperature of 634° C. at a temperature up rate of about 26° C. per minute, kept for five minutes or more in a heated state of 600° C. or higher, and then slowly cooled at a temperature down rate of about 13° C. per minute in this embodiment.

Thereafter, in order to prevent oxidation of the pin 1, the pin 1 is plated with Ni on its surface, further plated with Au thereon 0.04 μm or greater thick (about 0.35 μm in this embodiment), thereby forming an Ni plated layer and an Au plated layer. In this way, the pin 1 is completed.

With this making method, the pin 1 is heated to 600° C. to 900° C. and slowly cooled in the thermal treatment step. Hence, the pin 1 becomes softer than before the thermal treatment. This is considered due to the fact that this thermal treatment can remove the residual stress caused by the work distortion in forming the wire rod MT from 194 alloy or the work distortion in forming the enlarged diameter portion 1B of the pin 1 from the wire rod MT.

If the pin 1 is softer, the pin standing substrate employing this pin 1 can relieve a stress applied on the junction part between the pin 1 and the substrate or the substrate itself, because the pin 1 itself is deformed to absorb the stress when the stress is applied on the pin 1, as described below.

In particular, the pin 1 has the burr removed or is beveled in the barrel polishing step, and then is subjected to thermal treatment. Therefore, even if there occurs work hardening of the pin due to the barrel polishing, the residual stress can be removed by thermal treatment. Hence, it is possible to eliminate any influence of the barrel polishing. Accordingly, the barrel polishing being performed after the thermal treatment is more preferable than when the pin 1 softened is hardened again.

Since the pin 1 manufactured by this method has the enlarged diameter portion 1B containing a spherical surface, a pin standing substrate can relieve a stress applied on the pin 1 itself or the substrate itself, by absorbing the stress over a junction part between the pin 1 and the substrate, when the stress is applied on the pin 1. Therefore, the pin 1 itself or the substrate itself has less stress applied thereon.

Also, since the pin 1 and the substrate can be bonded with a quantity of solder, the bonding strength can be increased.

Therefore, if the pin standing substrate is produced using this pin 1 manufactured by this method, the pin standing substrate is unlikely to break down when a stress is applied on the pin 1, and is highly reliable.

Figure 5A:
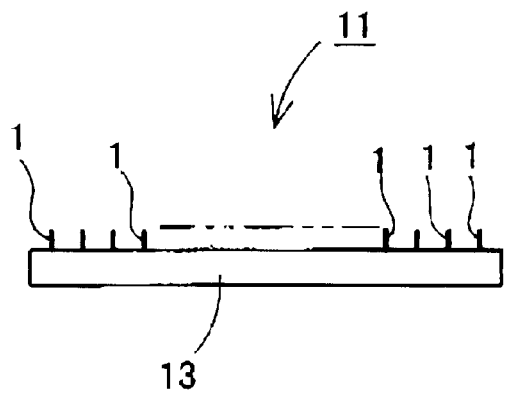
Figure 5B:
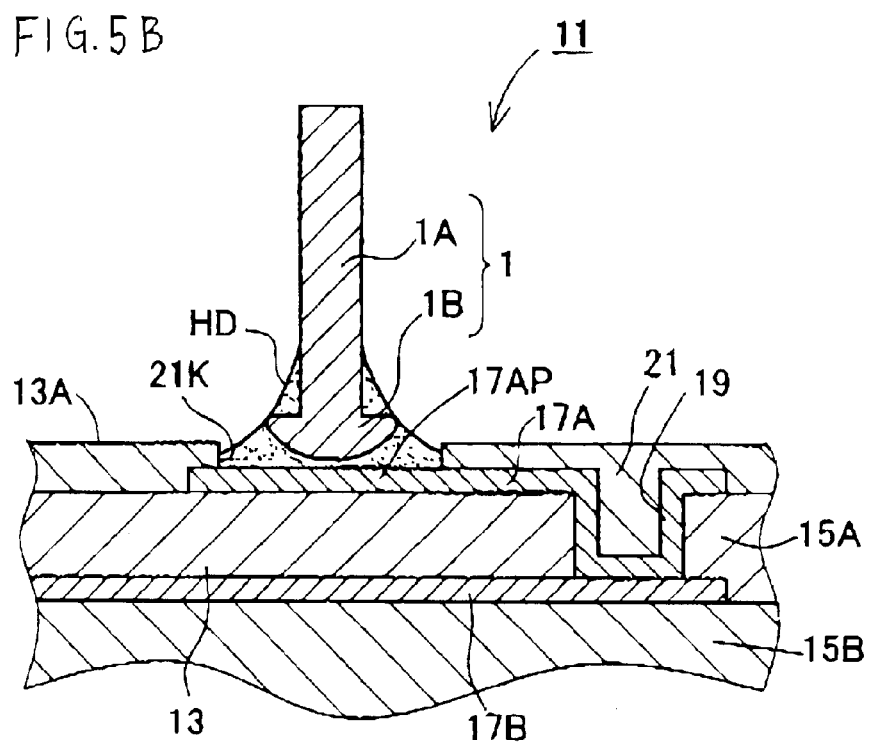

Referring now to FIG. 5, the pin standing resin substrate 11 of this embodiment will be described below FIG. 5A is a side view of the pin standing resin substrate 11 and FIG. 5B is a partially enlarged cross-sectional view.

This pin standing resin substrate 11 comprises a resin substrate 13 like an almost rectangular, substantially laminar (plate-like) shape, and a number of pins 1 standing on the resin substrate 13.

The resin substrate 13 is a multi-layer wiring substrate made of resin having a plurality of resin insulating layers 15A, 15B made of epoxy resin and laminated, and a solder resist layer 21 made of epoxy resin.

The conductor layers 17A, 17B for the wiring or pad are formed between the resin insulating layers 15A, 15B and between a resin insulating layer 15A and a solder resist layer 21, respectively. Also, the resin insulating layers 15A, 15B are formed with a number of via conductors 19 or through hole conductors (not shown) for connecting the conductor layers 17A, 17B with each other.

The solder resist layer 21 constituting a main surface 13A of the resin substrate 13 has a number of openings 21K formed at predetermined positions. And a pin-pad 17AP of the conductor layer 17 formed between the resin insulating layer 15A and the solder resist layer 21 is exposed within this opening 21K On the other hand, the pin 1 is fixed onto the resin substrate 13 by facing its enlarged diameter portion 1B (spherical surface) toward the pin-pad 17AP of the resin substrate 13, and bonding the entire enlarged diameter portion 1B and a part of the rod-like portion 1A on the side of the enlarged diameter portion 1B to the pin-pad 17AP by solder HD (Sn95%-Sb5%).

In this pin standing resin substrate 11, the pin 1 having the enlarged diameter portion 1B of substantially hemispherical shape is bonded by solder HD to the resin substrate 13, with the enlarged diameter portion 1B directed toward the pin-pad 17AP of the resin substrate 13. Therefore, when a stress is applied on the pin 1, the stress is prone to be absorbed over the junction part between the pin and the substrate. Hence, the stress applied on the pin 1 itself or the resin substrate 13 itself can be relieved.

Also, since a quantity of solder HD is secured between the enlarged diameter portion 1B and the pin-pad 17AP, the bonding strength can be increased.

And the pin 1 is heated to 600° C. to 900° C. and slowly cooled in the thermal treatment step. Hence, the pin 1 becomes softer than before the thermal treatment. The pin standing substrate employing this pin 1 can relieve a stress applied on the junction part between the pin 1 and the pin-pad 17AP or the resin substrate 13 itself, because the pin 1 itself is deformed to absorb the stress when the stress is applied on the pin 1. Herein, slow cooling means that the pin is cooled slowly.

Accordingly, this pin standing resin substrate 11 is unlikely to break down when subjected to a stress, and is highly reliable, due to a synergetic effect thereof.

In particular, in this pin standing resin substrate 11, the pin 1 has the burr removed or is beveled in the barrel polishing step, then subjected to thermal treatment, and fixed to the substrate. In other words, because of the use of the soft pin 1 not affected by work hardening of the pin due to the barrel polishing, the pin standing resin substrate 11 is unlikely to break down when the stress is applied on the pin, and highly reliable.

Then, the relation between the temperature of thermal treatment for the pin 1 and the bonding strength between the pin 1 and the resin substrate 13 will be described below with reference to Table 1.

To examine a difference in bonding strength between the pin 1 and the resin substrate 13 due to temperature difference of thermal treatment for the pin 1, the following investigation was made.

First of all, the first grasping step, the first press step, the second grasping step, the second press step, and the cutting step were performed as described above. Further, the barrel polishing step and the chemical etching step for the surface smoothing process were performed to form a number of pins 1 from the wire rod MT made of 194 alloy. In the pin thermal treatment step, the pin 1 was then heated to 470° C., 550° C., 634° C., 740° C., 880° C., or 950° C. at maximum, and thereafter cooled slowly, so that six sorts of pins I with different thermal treatment temperatures were obtained. Then, an Ni—Au plated layer was formed on the surface 1 of each sort of pin 1. And in the pin fixing step for the method of making the pin standing resin substrate 11, each sort of pin 1 was soldered to the resin substrate 13 to produce the pin standing resin substrate 11. Herein, for each sort of pin 1 with the same thermal treatment temperature, five pin standing resin substrates 11, viz., a total of 6×5=30 pin standing resin substrates 11 were produced.

Then, for each pin standing resin substrate 11, a tensile test for the pin 1 was conducted. Specifically, the tensile test was performed by picking up and pulling any one of a number of pins standing on the pin standing resin substrate 11, whereby if the pin 1 was cut away in the rod-like portion 1A of the pin 1 without breakage at the junction part between the pin 1 and the pin-pad 17AP, the pin 1 was made eligible, judging that the strength at the junction part was fully high. On the other hand, as a result of picking up and pulling the pin 1, the pin 1 which broke down at the junction part between the pin 1 and the pin-pad 17AP was made ineligible, judging that the strength at the junction part was low.

For each pin standing resin substrate 11, the tensile test was conducted for ten pins 1. Accordingly, a total of 50 pins 1 with the same thermal treatment temperature were tested, Further, besides the pins 1 made of 194 alloy, the pins 1 made of pure copper were examined in the same way.

These results are listed in Table 1 as below.

TABLE 1

Number of samples: 50 pins each

| Treatment Temperature (° C.) | Number of ineligible pins in tensile test | |
| --- | --- | --- |
| | 194 alloy pin | Pure copper pin |
| 470 | 3 | 5 |
| 550 | 1 | 2 |
| 634 | 0 | 0 |
| 740 | 0 | 0 |
| 880 | 0 | 0 |
| 950 | 0 | 0 |

As will be apparent from Table 1, the 194 alloy pin 1 and the copper pin 1 has a decreasing number of ineligible pin (pins 1 broken between the pin 1 and the pin-pad 17AP) as the treatment temperature is raised. And when the thermal treatment temperature is 634° C., 740° C., 880° C. and 950° C., the 914 alloy pin 1 and the pure copper pin 1 has no ineligible pin. From these, results, it can be found that if the thermal treatment is performed at temperatures of at least 550° C. or higher, its effect appears to prevent the breakage between the pin 1 and the pin-pad 17AP. Further, it can be found that if the thermal treatment is performed at temperatures of 634° C. or higher, there is almost no breakage between the pin 1 and the pin-pad 17AP.

In the above investigation, the upper limit temperature is 950° C., cause the pin 1 itself will melt at too high temperatures.

From these results, if the thermal treatment temperature is 550° C. or higher, preferably 600+ C. or higher, the pin 1 becomes fully soft, resulting in increased bonding strength between the pin 1 and the pin-pad 17AP. The thermal treatment temperature is preferably 900° C. or less in consideration of the melting point of the pin 1 and the cost for the thermal treatment.

Referring now to FIG. 6, a method for making the pin standing resin substrate 11 will be described below.

First of all, the pin 1 having the rod-like portion 1A and the enlarged diameter portion 1B is prepared. Specifically, the first grasping step, the first press step, the second grasping step, the second press step and the cutting step are performed, as previously described. Further, prior to the pin thermal treatment step, the barrel polishing step and the chemical etching step for the surface smoothing process are performed to form the pin from the 194 alloy wire rod MT.

Then, in a pin thermal treatment step, the pin 1 is subjected to thermal treatment of heating up to 600° C. to 900° C. More specifically, the pin 1 is heated to a maximum temperature of 634° C. at a temperature up rate of about 26+ C. per minute, kept for five minutes or more in a heated state of 600° C. or higher, and then slowly cooled at a temperature down rate of about 13° C. per minute in this embodiment. Consequently, the pin 1 gets rid of the work distortion due to the press or barrel polishing, and becomes fully soft.

Thereafter, in order to prevent oxidation of the pin 1, the pin 1 is plated with Ni about 3.34 μm thick on its surface, further plated with Au thereon about 035 μm or greater thick.

Figure 6A:
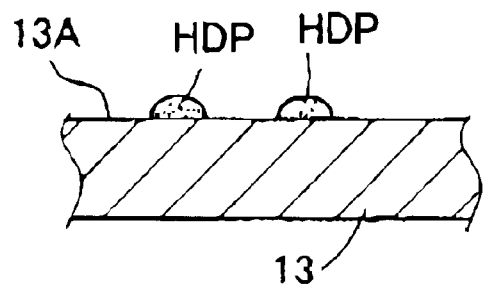

Then, the resin substrate 13 is prepared. This resin substrate 13 may have the resin insulating layer 15 and the conductor layer 17 formed alternately by a well-known method, and the solder resist layer 21 formed. And in a solder printing step, a predetermined amount of solder paste HDP (Sn 95%, Sb 5%) are printed on the pin-pad 17AP of the resin substrate 13, as shown in FIG. 6A.

Figure 6B:
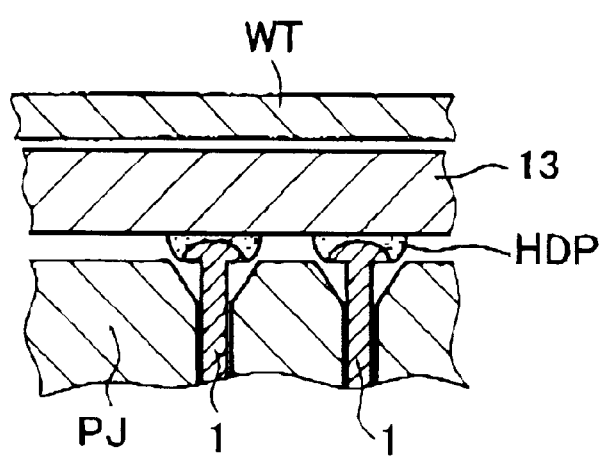

Then, in a pin setting step, the pins 1 are set up on a pinning jig PJ, and the resin substrate 13 printed with the solder paste HDP is placed in alignment thereon to bring the enlarged diameter portion 1B of the pin 1 into contact with the soldering paste HDP on the pin-pad 17AP, as shown in FIG. 6B. And a weight WT is placed there on to press the resin substrate 13.

Figure 6C:
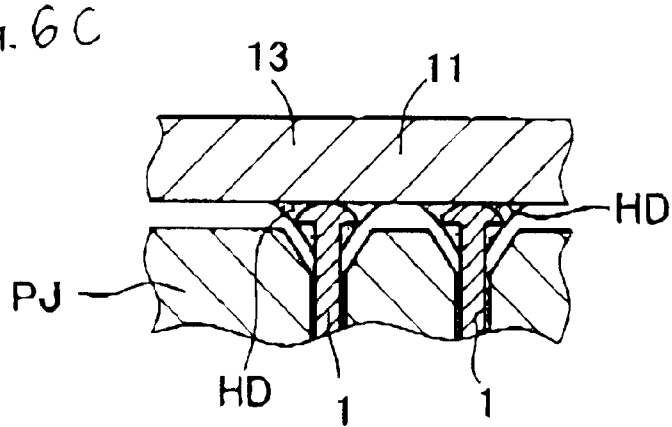

In a reflow step, the resin substrate 13 placed on the pinning jig PJ is laid within a reflow furnace to melt the solder paste HDP, as shown in FIG. 6C, to solder the enlarged diameter portion 1B of the pin 1 to the pin-pad 17AP, thereby completing the pin standing resin substrate 11. In this embodiment, the solder printing step, the pin setting step, and the reflow step correspond to the pin fixing step.

In this making method, the pin 1 is subjected to the thermal treatment of heating the pin to a temperature from 600° C. to 900° C. and slowly cooling the pin from the temperature. Hence, the pin 1 becomes softer than before the thermal treatment. Accordingly, the produced pin standing resin substrate 11 can relieve a stress applied on the junction part between the pin 1 and the resin substrate 13 or the resin substrate 13 itself, because the pin 1 itself is prone to absorb the stress when the stress is applied on the pin 1.

Also, in this making method, since the enlarged diameter portion 1B containing the spherical surface is brought into contact with the pin-pad 17AP and soldered, the produced pin standing resin substrate 11 can absorb the stress over the junction part between the pin and the resin substrate 13 and relieve the stress applied on the pin 1 itself or the resin substrate 13 itself, when the stress is applied on the pin 1. Between the enlarged diameter portion 1B of the pin 1 and the pin-pad 17AP, a quantity of solder can be secured. Hence, the strength at the junction part can be increased.

Accordingly, with this making method, the pin standing resin substrate 11 is unlikely to break down even though the stress is applied on the pin 1, and highly reliable.

Embodiment 2

Referring now to FIG. 7, the like parts as in the embodiment 1 are not described or only simply described.

The pin 1 of this embodiment 2 is the same as the pin 1 of the embodiment 1, and the making method is also the same (see FIGS. 1 to 4).

Figure 7A:
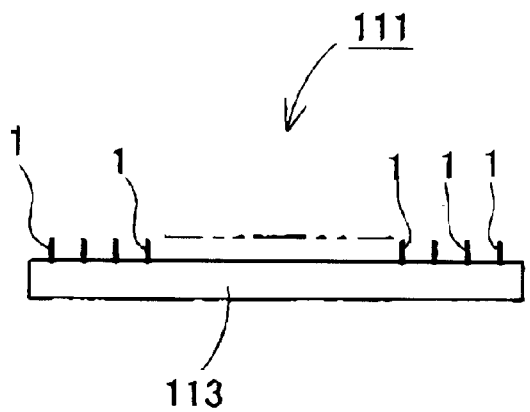
Figure 7B:
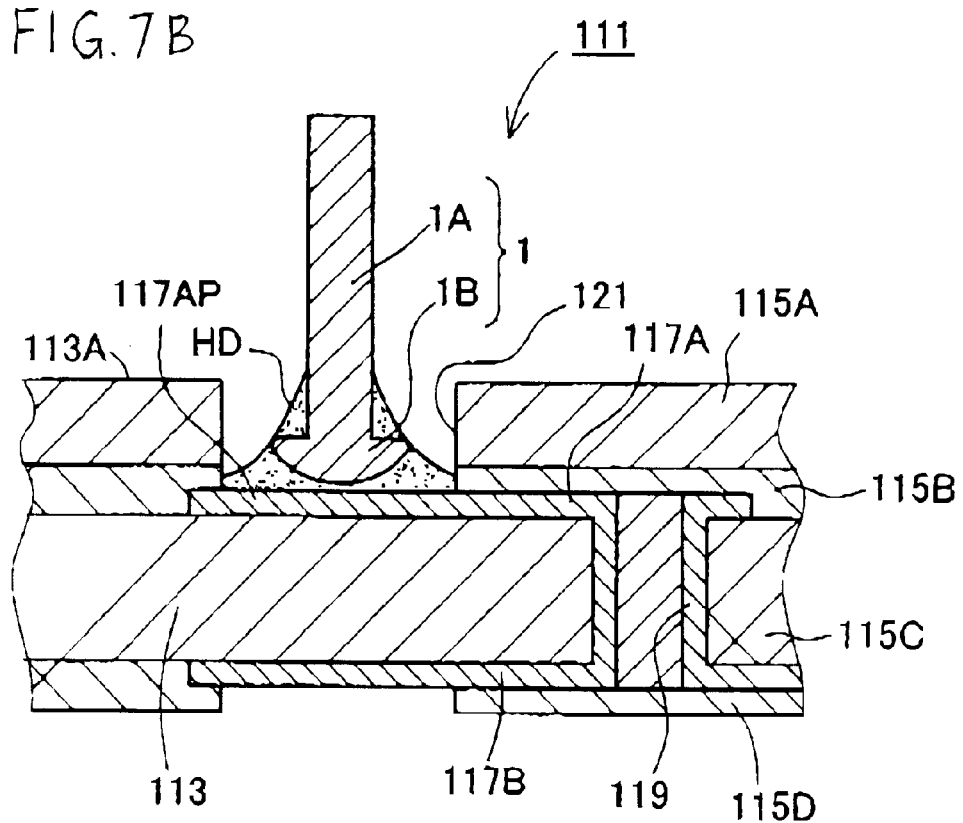

In a pin standing resin substrate 111, a resin substrate 113 is different from the resin substrate 13 of the embodiment 1, as shown in FIG. 7. FIG. 7A is a side view of the pin standing resin substrate 111, and FIG. 7B is a partially enlarged cross-sectional view.

This pin standing resin substrate 111 comprises the resin substrate 113 like an almost rectangular, substantially laminar (plate-like) shape, and a number of pins 1 standing on the resin substrate 113.

The resin substrate 113 is a multi-layer wiring substrate made of resin having a plurality of resin insulating layers 115A, 115B, 115C and 115D made of epoxy resin and laminated.

The conductor layers 117A, 117B for the wiring or pad are formed between the resin insulating layers 115B, 115C and between the resin insulating layer 115A and 115D, respectively. Also, a resin insulating layer 115C is formed with a number of through hole conductors 119 for connecting the conductor layers 117A, 1173 with each other.

On a main surface 113A of the resin substrate 113, an umber of concave portions 121 passing through two resin insulating layers 115A, 115B on the side of the main surface 113A are formed at predetermined positions. And a pin-pad 117AP of the conductor layer 117A is exposed from the bottom of the concave portion 121.

On the other hand, the pin 1 is fixed onto the resin substrate 113 by facing its enlarged diameter portion 1B (spherical surface) toward the pin-pad 117AP exposed from the bottom of the concave portion 121, and bonding the entire enlarged diameter portion 1B and a part of the rod-like portion 1A on the side of the enlarged diameter portion 1B to the pin-pad 117AP by solder HD.

The whole of the enlarged diameter portion 1B and a part of the rod-like portion 1A in the pin 1 are accommodated within the concave portion 121. The solder HD for bonding the pin 1 and the pin-pad 117AP is received within the concave portion 121 substantially totally.

In this pin standing resin substrate 111, the pin 1 having the enlarged diameter portion 1B of substantially hemispherical shape is bonded by solder HD to the resin substrate 113, with the enlarged diameter portion 1B directed toward the pin-pad 117AP of the resin substrate 113. Therefore, when a stress is applied on the pin 1, the stress is prone to be absorbed over the junction part between the pin and the substrate. Hence, the stress applied on the pin 1 itself or the resin substrate 113 itself can be relieved.

Also, since a quantity of solder HD is secured in the junction part between the pin 1 and the pin-pad 117AP, the bonding strength can be increased.

And the pin 1 is heated to 600° C. to 900° C. and slowly cooled in the thermal treatment step. Hence, the pin 1 becomes softer than before the thermal treatment. It is possible to relieve a stress applied on the junction part between the pin 1 and the resin substrate 113 or the resin substrate 13 itself, because the pin 1 itself is deformed to absorb the stress when the stress is applied on the pin 1.

Accordingly, this pin standing resin substrate 111 is unlikely to break down when subjected to a stress, and is highly reliable, due to a synergetic effect thereof.

Particularly, in this pin standing resin substrate 111, the pin-pad 117AF has the concave portion 121 exposed from the bottom, the enlarged diameter portion 1B of the pin 1 being accommodated within this concave portion 121. Accordingly, though the pin 1 is formed with the enlarged diameter portion 1B, there is a reduced gap between the pin standing resin substrate 111 and a socket when the pin 1 is inserted into the socket.

A making method of the pin standing resin substrate 111 in this embodiment 2 will be described below.

First of all, the pin 1 having the 1A and the enlarged diameter portion 1B is prepared in the same manner as in the embodiment 1. In a pin thermal treatment step, the pin 1 is heated to a temperature of 600° C. to 900° C., and thereafter cooled slowly After that, an Ni—Au plated layer is formed on the surface of the pin 1.

Then, the resin substrate 113 produced by a well-known method is prepared. And in a soldering ball charging step, a soldering ball is charged into each concave portion 121 formed on the resin substrate 113, dissolved and fixed to the pin-pad 117AP.

In a pinning jig setting step, the pins 1 are set up on a pinning jig PJ, and placed in alignment on the resin substrate 113.

In are flow step, the pinning jig PJ and the resin substrate 113 are laid within a reflow furnace to melt the solder again, to solder the enlarged diameter portion 1B of the pin 1 to the pin-pad 117AP, thereby completing the pin standing resin substrate 111. In this embodiment, the soldering ball charging step, the pinning jig setting step, and the reflow step correspond to the pin fixing step.

In this embodiment 2, the pin 1 is subjected to the thermal treatment of heating the pin to a temperature from 600° C. to 900° C. and slowly cooling the pin from the temperature. Hence, the pin 1 becomes softer than before the thermal treatment. Accordingly, the produced pin standing resin substrate 111 can relieve a stress applied on the junction part between the pin 1 and the resin substrate 113 or the resin substrate 113 itself, because the pin 1 itself is prone to absorb the stress when the stress is applied on the pin 1.

Also, since the enlarged diameter portion 1B containing the spherical surface is brought into contact with the pin-pad 117AP and soldered, the produced pin standing resin substrate 111 can absorb the stress over the junction part between the pin 1 and the resin substrate 113 and relieve the stress applied on the pin 1 itself or the resin substrate 113 itself, when the stress is applied on the pin 1.

Between the enlarged diameter portion 1B containing the spherical surface and the pin-pad 117AP, a quantity of solder HD can be secured. Hence, the bonding strength can be increased.

Hence, the pin standing resin substrate 111 can be produced which is unlikely to break down even though the stress is applied on the pin 1, and highly reliable.

Embodiment 3

An embodiment 3 will be described below. In the above embodiment 1, 2, the pin 1 is made of copper base metal such as 194 alloy or pure copper (oxygen free copper), and erected and soldered on the resin substrate. However, in this embodiment 3, the pin 1 is made of kovar (iron-nickel-cobalt alloy, 29Ni-16Co—Fe) that is an iron base metal. Also, in the above embodiments 1, 2, the pin 1 has the enlarged diameter portion 1B bulging in substantially hemispherical shape toward the side opposite to the rod-like portion 1A However, in the embodiment 3, the pin 1 has a so-called nailheaded shape with the almost circular enlarged diameter portion, and the sizes of the pin and the pin-pad are different. However, the other parts are the same as those of the embodiments 1, 2. Hence, the different parts are mainly described, and the same parts are not described or simply described here.

A pin 301 for use with this embodiment 3 is made of kovar, and comprises a rod-like portion 301A and an enlarged diameter portion 301B formed at one end (an upper end in the figure). This pin 301 is smaller than the pin 1 used in the embodiments 1, 2. The rod-like portion 301A has an almost cylindrical shape with a diameter of 0.31 mm and a height (axial length) of 1.83 mm. On the other hand, the enlarged diameter portion 301B has an almost circular shape with a diameter of 0.65 mm and a thickness of 0.20 mm. The pin 301 has a so-called nailhead.

This pin 301 is produced by the well-known method to mold the enlarged diameter portion 301B with the press using a wire rod of kovar. After molding this pin 301, the pin 301 is subjected to the barrel polishing step (see FIG. 4) and the chemical etching step for the surface smoothing process. Further, in the thermal treatment step of the pin, a tray TR receiving the pins 301 is laid on a belt BL looped between the rollers RO1, RO2 and moving at a predetermined speed, and passed through a belt furnace FP with a predetermined temperature profile given by a heater HT to effect thermal treatment of heating and slowly cooling, as shown in FIG. 9. Specifically, the pins 301 were heated to a maximum temperature of 792° C. at a belt speed of 150 mm/min, kept for four to five minutes in a heated state of 780° C. or higher, and thereafter cooled slowly.

Thereby, the pin 301 is softer than before the thermal treatment. In other words, the hardness is reduced. This is considered due to the fact that the pin 301 is hardened owing to the work hardening in drawing the wire rod from the raw material of kovar, work hardening informing the enlarged diameter portion 301B, or work hardening due to barrel polishing, and then softened owing to the thermal treatment.

A pin standing resin substrate with the pins 301 erected will be described below. This pin standing resin substrate 311 comprises a resin substrate 313 like an almost rectangular, substantially laminar (plate-like) shape, with a number of pins 301 thermally treated standing on one face (an upper face in the figure) of the resin substrate 313. The resin substrate 313 is a multi-layer wiring substrate made of resin having a plurality of resin insulating layers 315A, 315B made of epoxy resin and laminated, and a solder resist layer 321 made of epoxy resin laid on the top surface.

The conductor layers 317A, 317B for the wiring or pad are formed between the resin insulating layers 315A, 315B and between a resin insulating layer 315A and a solder resist layer 321, respectively Also, the resin insulating layers 315A, 315B are formed with a number of via conductors 319 or through hole conductors (not shown) for connecting the conductor layers 317A, 317B with each other.

The solder resist layer 321 constituting a main surface 313A of the resin substrate 313 has a number of openings 321K formed at predetermined positions. Each opening 321K has a diameter of 1.0 mm, and has a pin-pad 317AP constituting a part of the conductor layer 317 exposed therein The pin 1 is fixed onto the resin substrate 13 by facing its enlarged diameter portion 301B toward the pin-pad 317AP, and bonding an end face (a lower face in the figure) and the side faces of the enlarged diameter portion 301B to the pin-pad 301AP by solder HD.

On the face (an upper face in the figure) of the enlarged diameter portion 301B on the side of the rod-like portion, the solder HD is not spread by wetting, or somewhat spread by wetting.

In this pin standing resin substrate 311, the pin 1 is subjected to the thermal treatment at high temperatures, and thus softer than the pin 301 not subjected to the thermal treatment, and hardened by work hardening. Therefore, when a stress is applied on the pin 301, the pin 301 itself is deformed to absorb the stress. Hence, it is possible to relieve the stress applied on the junction part between the pin 301 and the pin-pad 317AP or the resin substrate 313 itself, and prevent breakage of the junction part. Therefore, this pin standing resin substrate 311 is unlikely to break down when the stress is applied on the pin 301, and highly reliable.

In this pin standing resin substrate 311, the pin 301 has the burr removed or is beveled in the barrel polishing step, then subjected to thermal treatment, and fixed to the substrate. In other words, because of the use of the soft pin 1 not affected by work hardening of the pin due to the barrel polishing, the pin standing resin substrate 311 is unlikely to break down when the stress is applied on the pin, and highly reliable.

Then, the relation between the temperature of thermal treatment for the pin 301 made of kovar the hardness of the pin 301 (Vickers hardness Hv) and the bonding strength between the pin 301 and the resin substrate 313 will be described below.

To examine a difference in Vickers hardness Hv of the pin 301 and bonding strength between the pin 301 and the resin substrate 313 due to temperature difference of thermal treatment for the pin 301, the following investigation was made.

First of all, the pins 301 were formed by the well-known method. Further, the barrel polishing step and the chemical etching step for the surface smoothing process were performed to form a number of pins 301 made of kovar.

Figure 8:
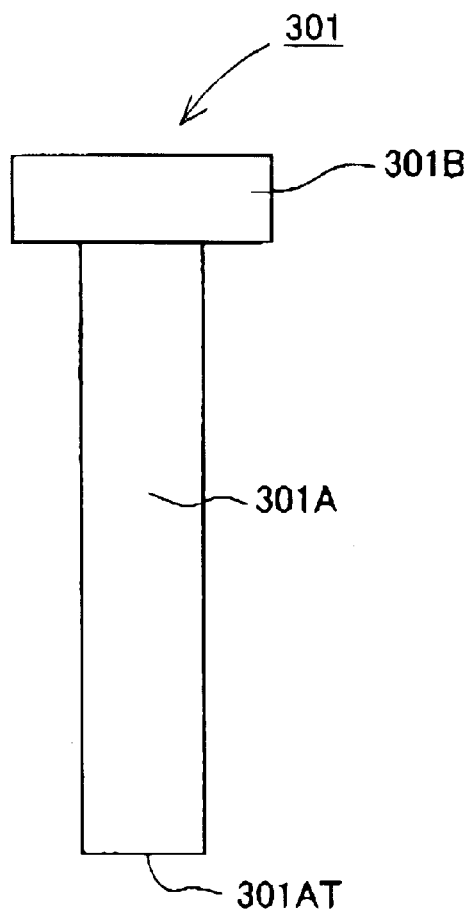
FIG. 8 is a side view illustrating the shape of a pin according to an embodiment 3.

The temperature profile of the belt furnace FP as shown in FIG. 9 is changed, the feed speed of a belt BL is selected from two sorts of speed (300 mm/min, 150 mm/min). In the pin thermal treatment step, the pin 301 was then heated to 350° C., 382° C., 582+ C., 593° C., 795° C., 940° C. or 945° C. at maximum, besides 792° C., and thereafter cooled slowly, so that nine sorts of pins 301 with different thermal treatment temperatures including one sort of pin kept at zoom temperature without thermal treatment were obtained. For these nine sorts of pins 301 (five pins for each sort), the Vickers hardness Hv was measured at a top end 301AT of the rod-like portion 301A (see FIG. 8) by a micro Vickers measuring apparatus (MVK-E2 manufactured by AKASHI, the measuring conditions: a load of 500 g, 15 seconds). The results are listed in Table 2. The relation between the maximum temperature of thermal treatment and the average value of Vickers hardness is shown in FIG. 11.

the belt speed, the Vickers hardness Hv is suddenly lowered. For the pins subjected to the thermal treatment at the maximum temperature of 600° C. or more, or particularly the maximum temperature of 700° C. or more, that is, the maximum temperature of 795° C., 792° C., 940° C., or 945° C., the Vickers hardness Hv is 200 or less, or more specifically, a value as low as 170 or less in terms of the maximum value, or 150 or less in terms of the average value. Thus, it can be seen that the pin is made softer owing to the thermal treatment. This is considered due to the fact that the pin is softened.

Thereafter, an Ni plated layer (2.7 to 3.3 μm) and an Au plated layer (0.28 to 0.39 μm) were formed on the surface of each sort of pin 301. This Ni-Au plated layer allows the Vickers hardness Hv to be increased by about 10 to 20, depending on the thickness of the plated layer. However, the lower hardness due to the thermal treatment is apparent even in consideration of the increased hardness by plating.

And each sort of pin 301 was soldered to the resin substrate 313 to produce the pin standing resin substrate 311. Herein, for each sort of pin 301 under the same thermal treatment conditions, three pin standing resin substrates 311, viz., a total of 9×3=27 pin standing resin substrates 311 were produced.

Then, for each pin standing resin substrate 311, a tensile test for the pin 301 was conducted. Specifically, the tensile test was performed by picking up any one of a number of pins 301 standing on the pin standing resin substrate 311, and pulling it in a direction inclined by 30 degrees with respect to the pin shaft extending orthogonally to the main surface 313A of the resin substrate 313. Ten pins 301 for

TABLE 2 n = 5 pcs

| Maximum Temp. (° C.) | Room Temp. | 350 | 382 | 582 | 593 | 795 | 792 | 940 | 945 |
|---|---|---|---|---|---|---|---|---|---|
| Speed (mm/min) | — | 300 | 150 | 300 | 150 | 300 | 150 | 300 | 150 |
| Average value | 247.6 | 259.2 | 260.4 | 258.0 | 256.0 | 146.6 | 147.6 | 147.0 | 147.8 |
| Maximum vale | 263 | 273 | 284 | 273 | 279 | 162 | 154 | 157 | 153 |
| Minimum value | 217 | 241 | 237 | 248 | 223 | 135 | 133 | 139 | 143 |
| Standard deviation | 18.43 | 12.97 | 18.01 | 10.02 | 21.11 | 10.97 | 8.96 | 7.07 | 3.96 |

As will be apparent from Table 2 and a graph of FIG. 11, the pin 301 made of kovar has an average value of Vickers hardness as high as about 250, or the pin 301 is stiff, in the case where the thermal treatment is not made at room temperature and the thermal treatment is made at the maximum temperature of 593° C. or less. On the contrary, if the temperature of thermal treatment is increased to the maximum temperature of more than 593° C. Without regard to each pin standing resin substrate 311 were tested, and the strength was measured when the pin 301 was broken away or disconnected from the resin substrate 313. Accordingly, a total of 30 pins thermally treated at the same temperatures were tested.

These results are listed in Table 3. And how the average value of tensile strength changes is shown in FIG. 12.

TABLE 3 n = 30 pcs

| Maximum Temp. (° C.) | Room Temp. | 350 | 382 | 582 | 593 | 795 | 792 | 940 | 945 |
|---|---|---|---|---|---|---|---|---|---|
| Speed (mm/min) | — | 300 | 150 | 300 | 150 | 300 | 130 | 300 | 150 |
| Average value (N) | 23.6 | 23.9 | 23.0 | 22.9 | 22.6 | 27.9 | 29.0 | 32.2 | 33.9 |

TABLE 3-continued

| Maximum Temp. (° C.) | Room Temp. | 350 | 382 | 582 | 593 | 795 | 792 | 940 | 945 |
|---|---|---|---|---|---|---|---|---|---|
| | | | | | | | | n = 30 pcs | |
| Maximum vale (N) | 32.9 | 34.5 | 38.4 | 42.0 | 35.7 | 37.9 | 38.9 | 40.3 | 40.7 |
| Minimum value (N) | 12.3 | 14.0 | 13.8 | 14.1 | 16.7 | 23.2 | 22.8 | 24.5 | 26.7 |
| Standard deviation (N) | 5.30 | 4.34 | 5.77 | 5.50 | 4.84 | 2.89 | 4.00 | 4.12 | 4.11 |

As will be apparent from Table 3 and a graph of FIG. 12, the pin 301 made of kovar has a low tensile strength in the case where the thermal treatment is not made at room temperature and the thermal treatment is made at the maximum temperature of 593° C. or less. On the contrary, in the case where the temperature of thermal treatment is increased without regard to the belt speed, it will be found that for the pins subjected to the thermal treatment at the maximum temperature of 600° C. or more, or particularly the maximum temperature of 700° C. or more, that is, the maximum temperature of 795° C., 792° C., 940° C., or 945° C., the tensile strength is increased to 25N or more in terms of the average value.

One criterion for judging the tensile strength of this pin often involves that the tensile strength is 22.2N (=227 kgf) or greater. For this requirement, when the maximum temperature is below 600° C., its minimum value is as low as about 12 to 14N. It can be found that the pins not meeting this requirement may be contained. On the contrary, it will be found that for the pins subjected to the thermal treatment at the maximum temperature of 600° C. or more, or particularly the maximum temperature of 795° C., 792° C., 940° C., or 945° C., the minimum value exceeds 22.2N, and any pin can meet this requirement (standard).

In particular, for the pins with the maximum temperature of 900° C. or more, or specifically 940° C. or 945° C., the tensile strength is as high as 30N or greater in average value, or 24N or greater in minimum value, resulting in highly reliable pin standing resin substrate 311.

From the above test results, it can be found that the maximum temperature is preferably 700° C. or more, because there is a tendency that the tensile strength is increased with higher maximum temperature. In particular, if the maximum temperature is 900° C. or more, the tensile strength can be as high as 30N or greater. On the other hand, the upper limit of the maximum temperature is required to be as high as about 1400° C. because the melting point of kovar is about 1400° C. Since the thermal treatment at high temperatures requires the corresponding installation or costs, the maximum temperature of thermal treatment should be as low as possible, preferably 1100° C. or less, and more preferably 1000° C. or less.

Further, the relation between the Vickers hardness Hv of pin (average value) and the tensile strength (average value) inclined 30 degrees is shown in a graph of FIG. 13. As will be seen from this graph of scatter diagram, in the pin standing at resin substrate having soldered the pins 301 as soft as the Vickers hardness Hv of pin is 200 or less, moreover 170 or less, or specifically 150 or less in average value, the tensile strength is improved to be 25N or greater in average value. Accordingly, in this embodiment, the connection strength between the pin and the resin substrate can be increased, employing the pins 301 having the Vickers hardness of 200 or less, more preferably 170 or less, as well as the pins 301 subjected to thermal treatment, whereby the reliability of the pin standing resin substrate 311 can be enhanced.

The examination of the pins 301 made of 42 alloy (42 Ni—Fe) indicated the almost same results.

The tensile strength inclined 30 degrees per unit area of pin-pad is calculated by dividing The results as listed in Table 3 by the area of pin-pad 317AP, and listed in Table 4. Herein, the diameter of pin-pad 317AP is 1.00 mm, and therefore the tensile strength as listed in Table 4 is a value divided by the area (=π/4) of pin-pad 317AP.

TABLE 4

Tensile strength inclined 30 degrees per a unit area of pin-pad (N/mm2)

| Maximum Temp. (° C.) | Room Temp. | 350 | 382 | 582 | 593 | 795 | 792 | 940 | 945 |
|---|---|---|---|---|---|---|---|---|---|
| | | | | | | | | n = 30 pcs | |
| Speed (mm/min) | — | 300 | 150 | 300 | 150 | 300 | 150 | 300 | 150 |
| Average value (N/mm²) | 30.1 | 30.4 | 29.3 | 29.2 | 28.8 | 35.5 | 36.9 | 41.0 | 43.2 |
| Maximum vale (N/mm²) | 41.9 | 43.9 | 48.9 | 53.5 | 45.5 | 48.3 | 49.6 | 51.3 | 51.8 |
| Minimum value (N/mm²) | 15.7 | 17.8 | 17.6 | 18.0 | 21.3 | 29.6 | 29.0 | 31.2 | 34.0 |

TABLE 4-continued

Tensile strength inclined 30 degrees
per a unit area of pin-pad (N/mm2)

n = 30 pcs

| Maximum Temp. (° C.) | Room Temp. | 350 | 382 | 582 | 593 | 795 | 792 | 940 | 945 |
|---|---|---|---|---|---|---|---|---|---|
| Standard deviation (N/mm$^2$) | 6.75 | 5.77 | 7.35 | 7.01 | 6.17 | 3.68 | 5.10 | 5.25 | 5.24 |

From the results of Table 4, it can be found that the pin 301 has a low tensile strength inclined 30 degrees per unit area of pin-pad in the case where the thermal treatment is not made at room temperature and the thermal treatment is made at the maximum temperature of 593° C. or less. On the contrary, it will be found that for the pins subjected to the thermal treatment at the maximum temperature of 600° C. or more, or particularly the maximum temperature of 700° C. or more, that is, the maximum temperature of 795° C., 792° C., 940° C., or 945° C., the tensile strength inclined 30 degrees per unit area of pin-pad is increased to 31.8N/mm2 or more in terms of the average value.

Also, it will be found that for the pins subjected to the thermal treatment at the maximum temperature of 600° C. or more, or particularly the maximum temperature of 795° C., 792° C., 940° C., or 945° C., the minimum value exceeds 28.3N/mm2, and can be increased for any pin.

In particular, for the pins with the maximum temperature of 900° C. or more, or specifically 940° C. or 945° C., the tensile strength inclined 30 degrees per unit area of pin-pad is as high as 38.2N/mm2 or greater in average value, or 30.6N/mm2 or greater in minimum value, resulting in highly reliable pin standing resin substrate 311.

The production of the pin standing resin substrate 311 in this embodiment can be made in the same way as in the embodiments 1, 2 That is, the pins 301 made of cover are produced, and subjected to the barrel polishing step, the surface smoothing process step, and the thermal treatment. Thereafter, the pins 301 are plated with Ni and Au. Separately, the resin substrate 313 is prepared as shown in FIG. 14A. In this figure, the resin substrate 313 is illustrated in the simplified form. On this resin substrate 313, the resin insulating layer 315 and the conductor layer 317 may be formed alternately by a well-known method, and then the solder resist layer 321 formed (see FIG. 10).

Thereafter, the pin 301 is fixed to the resin substrate 313. Specifically, a predetermined amount of soldering paste HDP (Sn 95%-Sb 5%, the melting point 235 to 240° C.) is printed on the pin-pad 317AP of the resin substrate 313 in a solder printing step, as shown in FIG. 14A.

In the setting step, the pin 301 is set in a pin insertion hole PJH formed in the pinning jig PJ Then, the resin substrate 313 printed with the soldering paste HDP is laid in alignment thereon to bring the enlarged diameter portion 301B of the pin 301 into contact with the soldering paste HDP on the pin-pad 317AP, as shown in FIG. 14B. And a weight AT is placed thereon to press the resin substrate 313.

Further, in a reflow step, the resin substrate 313 laid on the pinning jig PC is introduced into the reflow furnace, and heated up to a temperature as high as 260 to 265° C. to dissolve the soldering paste HDP, and to solder the enlarged diameter portion 301B of the pin 301 to the pin-pad 317AP, as shown in FIG. 14C, whereby the pin standing resin substrate 311 is completed.

Thus, this invention has been described above in connection with the embodiments 1, 2 and 3. However, this invention is not limited to the above embodiments, but may be appropriately changed without departing from the scope or spirit of the invention.

For example, in the embodiments 1, 2, the pin 1 has the enlarged diameter portion 1B of substantially rectangular shape However, the enlarged diameter portion may have other shapes, e.g., an almost circular shape, as in this embodiment 3. With the pin of such shape, the pin is thermally treated at high temperatures, and softened. Hence, the pin standing resin substrate 11, 111 is unlikely to break down when a stress is applied on the pin, and highly reliable.

The enlarged diameter portion 1B may be comprised of, for example, a disk portion of almost circular shape formed at the end of the rod-like portion, and a hemispherical portion of roughly hemispherical shape made of silver solder and bulging from the disk portion in a direction opposite to the side of TTO the rod-like portion. With such enlarged diameter portion 1B, the same effects can be obtained as described in the embodiments 1, 2.

Moreover, the pin made of kovar or 42 alloy as employed in the embodiment 3 may be formed with the enlarged diameter portion of roughly hemispherical shape in the same manner as in the embodiments 1, 2.

In the above embodiments, the Sn/Sb base solder is used as the solder JL. However, the Pb/Sn base solder or Sn/Ag base solder may be employed.

The entire disclosure of each and every foreign patent application from which the benefit of foreign priority has been claimed in the present application is incorporated herein by reference, as if fully set forth.

What is claimed is:

1. A pin standing resin substrate comprising:
   a resin substrate having a substantially plate-shaped main surface and comprising one of a resin and a composite material containing a resin, with a pin-pad exposed from the main surface; and
   a pin subjected to thermal treatment so as to soften the pin, and including a rod-like portion and an enlarged diameter portion having the same material as the rod-like portion, the enlarged diameter portion having, a larger diameter than the rod-like portion and being formed at one end of the rod-like portion, the enlarged diameter portion including a side facing the pin-pad and made of the same material as the enlarged diameter portion; and
   a solder contacting the pin-pad and the side of the enlarged diameter portion facing the pin-pad and defining a single solder joint between the pin and the pin-pad.

2. The pin standing resin substrate according to claim 1, wherein the thermal treatment is heating at 600° C. or higher.

3. The pin standing resin substrate according to claim 1, wherein the thermal treatment is heating at 600 to 900° C.

4. The pin standing resin substrate according to claim 1, wherein the heating treatment is heating at 700° C. or higher, and the rod-like portion and the enlarged diameter portion comprise one of kovar and 42 alloy.

5. The pin standing resin substrate according to claim 1, wherein the rod-like portion and the enlarged diameter portion comprise one of kovar and 42 alloy, and the pin has a Vickers hardness Hv of 200 or less.

6. The pin standing resin substrate according to claim 5, wherein the pin is subjected to thermal treatment of reducing the Vickers hardness.

7. The pin standing resin substrate according to of claim 1, wherein the enlarged diameter portion of the pin contains a spherical surface opposite to the rod-like portion.

8. The pin standing resin substrate according to claim 1, wherein the main surface has a concave portion having a bottom portion at least on which the pin-pad is exposed, and at least the enlarged diameter portion is received in the concave portion and at least a part of the rod-like portion projects from the main surface.

9. A method of making a pin standing resin substrate, which comprises:
  a pin thermal treatment step of subjecting a pin to thermal treatment by heating so as to soften the pin, wherein the pin comprises a rod-like portion and an enlarged diameter portion having the same material as the rod-like portion, the enlarged diameter portion having a larger diameter than the rod-like portion and being formed at one end of the rod-like portion, the enlarged diameter portion including a side opposite to the rod-like portion and facing away from the rod-like portion, the side having the same material as the enlarged diameter portion; and
  a pin fixing step of soldering a pin-pad with at least the side of the enlarged diameter portion of the pin, so as to fix the pin with a resin substrate, wherein the resin substrate has a substantially plate-shaped main surface and comprises one of a resin and a composite material containing a resin, with the pin-pad exposed from the main surface.

10. The method of making a pin standing resin substrate according to claim 9, wherein the heating is at 600° C. or higher.

11. The method of making a pin standing resin substrate according to claim 9, wherein the heating is at 600° C. to 900° C.

12. The method of making a pin standing resin substrate according to claim 9, wherein the heating is at 700° C. or higher, and the rod-like portion and the enlarged diameter portion comprise one of kovar and 42 alloy.

13. The method of making a pin standing resin substrate, which comprises:
  a pin hardness reducing step of reducing the Vickers hardness (Hv) of a pin to 200 or less, wherein the pin comprises a rod-like portion and an enlarged diameter portion having the same material comprising one of kovar and 42 alloy, the enlarged diameter portion having a larger diameter than the rod-like portion and being formed at one end of the rod-like portion; and
  a pin fixing step of soldering a pin-pad with at least the enlarged diameter portion of the pin, so as to fix the pin with a resin substrate, wherein the resin substrate has a substantially plate-shaped main surface and comprises one of a resin and a composite material containing a resin, with the pin-pad exposed from the main surface.

14. The method of making a pin standing resin substrate according to claim 13, wherein the pin hardness reducing step is a pin thermal treatment step of making thermal treatment by heating the pin to reduce the Vickers hardness.

15. The method of making the pin standing resin substrate according to any one of claims 9 to 12 and 14, further including a mechanical polishing step of mechanically polishing the pin prior to the pin thermal treatment step.

16. A method of making a pin standing resin substrate, which comprises: a pin fixing step of soldering a pin-pad with at least an enlarged diameter portion of a pin, so as to fix the pin to a resin substrate,
  wherein the resin substrate has a substantially plate-shaped main surface and comprises one of a resin and a composite material containing a resin, with the pin-pad exposed from the main surface, the pin has a Vickers hardness (Hv) of 200 or less, and the pin comprises a rod-like portion and an enlarged diameter portion having the same material comprising one of kovar and 42 alloy, the enlarged diameter portion having a larger diameter than the rod-like portion and being formed at one end of the rod-like portion.

17. A pin for use in a pin standing substrate having at least one pin as an input/output terminal standing thereon, which comprises:
  a rod-like portion; and
  an enlarged diameter portion having the same material as the rod-like portion, with a larger diameter than the rod-like portion and formed at one end of the rod-like portion,
  wherein the pin is subjected to thermal treatment by heating so that a Vickers hardness of the rod-like portion and the enlarged diameter portion is reduced to 200 or less.

18. The pin according to claim 17, wherein the heating is at 600° C. or higher.

19. The pin according to claim 17, wherein the heating is at 600° C. to 900° C.

20. The pin according to claim 17, wherein the rod-like portion and the enlarged diameter portion comprise one of kovar and 42 alloy, and the heating is at 700° C. or higher.

21. The pin according to claim 17, wherein the rod-like portion and the enlarged diameter portion comprise one of kovar and 42 alloy.

22. The pin according to claim 21, wherein the Vickers hardness is reduced by thermal treatment of heating the pin.

23. The pin according to claim 17, wherein the enlarged diameter portion of the pin contains a spherical surface opposite to the rod-like portion.

24. A method of making a pin for use in a pin standing substrate having at least one pin as an input/output terminal standing thereon, which comprises:
  a thermal treatment step of making thermal treatment by heating so as to reduce a Vickers hardness of the rod-like portion and the enlarged diameter portion to 200 or less,
  wherein the pin comprises a rod-like portion and an enlarged diameter portion having the same material as the rod-like portion, with a larger diameter than the rod-like portion and formed at one end of the rod-like portion.

25. The method according to claim 24, wherein the heating is at 600° C. or higher.

26. The method according to claim 24, wherein the heating is at 600° C. to 900° C.

27. The method according to claim 24, wherein the heating is at 700° C. or higher, and the rod-like portion and the enlarged diameter portion comprises one of kovar and 42 alloy.

28. The method according to claim 24, wherein the rod-like portion and the enlarged diameter portion comprises one of kovar and 42 alloy.

29. The method according to claim 28, wherein the pin hardness reducing step is the thermal treatment step of making thermal treatment by heating the pin to reduce the Vickers hardness.

30. The method according to claim 24, which further comprises a mechanical polishing step of mechanically polishing the pin prior to the thermal treatment step.

31. A pin standing resin substrate comprising:
- a resin substrate having a substantially plate-shaped main surface and comprising one of a resin and a composite material containing a resin, with a pin-pad exposed from the main surface; and
- a pin including a rod-like portion and an enlarged diameter portion having the same material as the rod-like portion, the enlarged diameter portion having a larger diameter than the rod-like portion and being formed at one end of the rod-like portion, the enlarged diameter portion including a side facing the pin-pad and made of the same material as the enlarged diameter portion; and
- a solder contacting the pin-pad and the side of the enlarged diameter portion facing the pin-pad and defining a single solder joint between the pin and the pin-pad, wherein the rod-like portion and the enlarged diameter portion comprise one of kovar and 42 alloy, and the pin has a Vickers hardness Hv of 200 or less.

\* \* \* \* \*